United States Patent
Lin et al.

(10) Patent No.: US 9,892,997 B2
(45) Date of Patent: Feb. 13, 2018

(54) ADAPTABLE MOLDED LEADFRAME PACKAGE AND RELATED METHOD

(71) Applicant: Infineon Technologies Americas Corp., El Segundo, CA (US)

(72) Inventors: Heny Lin, Irvine, CA (US); Katsumi Okawa, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 60 days.

(21) Appl. No.: 15/133,135

(22) Filed: Apr. 19, 2016

(65) Prior Publication Data
US 2017/0301613 A1   Oct. 19, 2017

(51) Int. Cl.
| | |
|---|---|
| *H01L 23/495* | (2006.01) |
| *H01L 23/31* | (2006.01) |
| *H01L 29/20* | (2006.01) |
| *H01L 29/16* | (2006.01) |
| *H01L 29/778* | (2006.01) |

(52) U.S. Cl.
CPC .... *H01L 23/49562* (2013.01); *H01L 23/3114* (2013.01); *H01L 23/4952* (2013.01); *H01L 29/1608* (2013.01); *H01L 29/2003* (2013.01); *H01L 29/7787* (2013.01)

(58) Field of Classification Search
CPC ......... H01L 23/49541; H01L 23/49517; H01L 2224/48247
See application file for complete search history.

(56) References Cited

U.S. PATENT DOCUMENTS

| | | | | |
|---|---|---|---|---|
| 5,302,849 A | * | 4/1994 | Cavasin ............. | H01L 23/3107 257/666 |
| 5,608,359 A | * | 3/1997 | Knecht .................. | H03L 1/028 257/666 |
| 5,631,193 A | * | 5/1997 | Burns ................. | H01L 23/4951 257/E23.039 |
| 7,402,507 B2 | * | 7/2008 | Standing ............. | H01L 21/4825 257/E21.705 |
| 8,629,539 B2 | * | 1/2014 | Milano .............. | G01R 33/0076 238/123 |
| 9,007,117 B2 | * | 4/2015 | Weis .................... | H03K 17/687 327/430 |
| 9,529,013 B2 | * | 12/2016 | Racz .................... | G01R 1/0416 |

* cited by examiner

*Primary Examiner* — John C Ingham
(74) *Attorney, Agent, or Firm* — Shumaker & Sieffert, P.A.

(57) ABSTRACT

A semiconductor package includes at least one semiconductor device situated on a leadframe island, a first at least one lead protruding from a first side of the semiconductor package and configured to provide a first electrical connection to at least one terminal of the at least one semiconductor device, a second at least one lead protruding from a second side of the semiconductor package and configured to provide a second electrical connection to the at least one terminal of the at least one semiconductor device, and a continuous conductive structure configured to provide a conductive path between the first at least one lead, the second at least one lead, and the at least one terminal of the at least one semiconductor device through the leadframe island such that the at least one semiconductor device continues to function after trimming the first at least one lead.

20 Claims, 13 Drawing Sheets

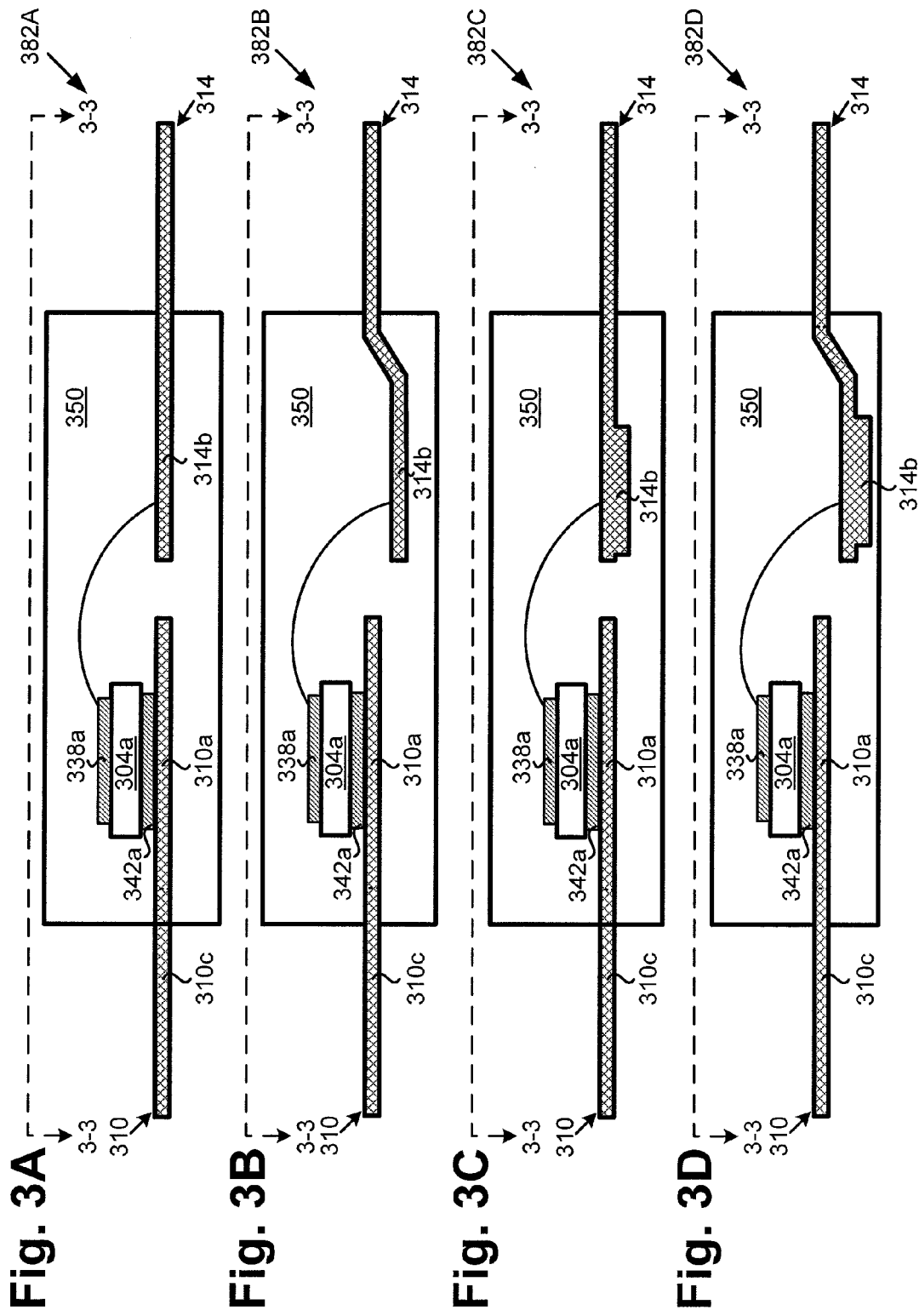

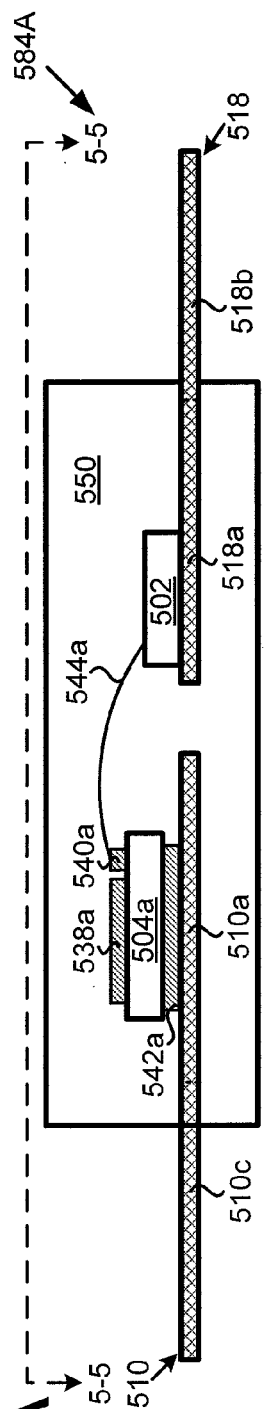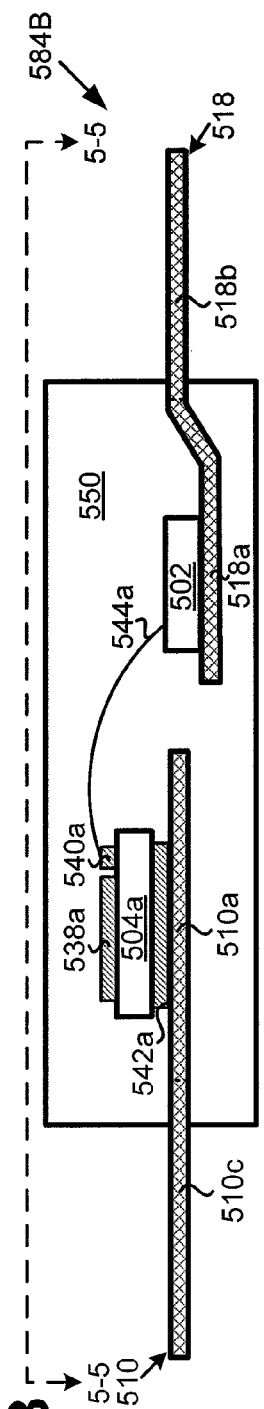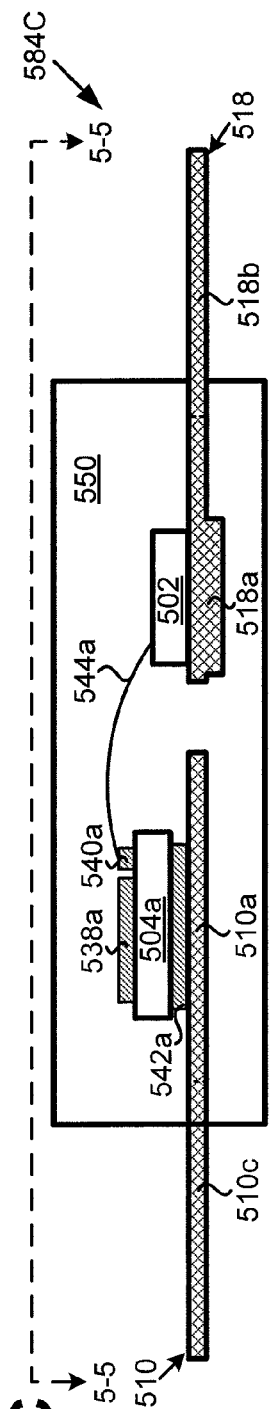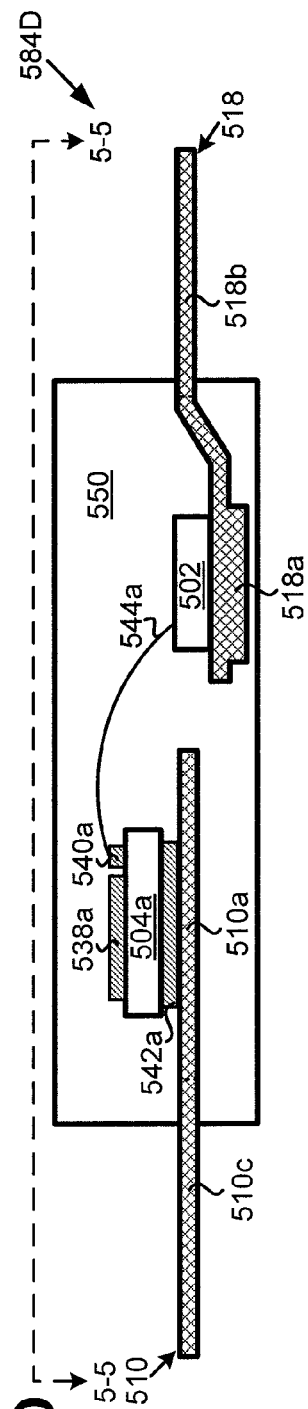

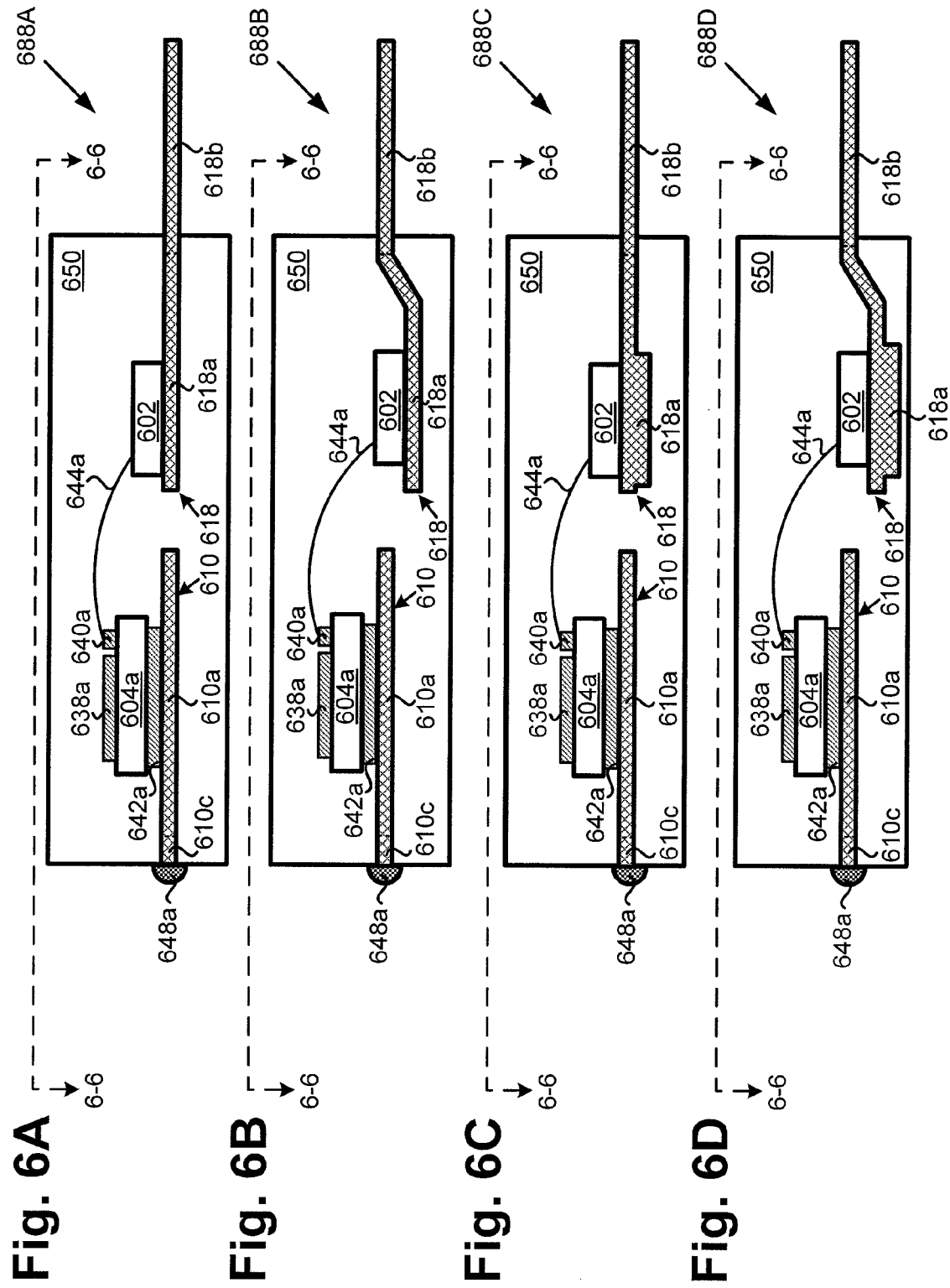

ADAPTABLE MOLDED LEADFRAME PACKAGE AND RELATED METHOD

BACKGROUND

A leadframe assembly, often having a leadframe and one or more semiconductor dies can simplify circuit design, reduce costs, and provide greater efficiency and improved performance by keeping related and dependent circuit components in close proximity. Also, a leadframe assembly can facilitate application integration and greater electrical and thermal performance compared to using separate packaging for various circuit components.

Conventional leadframe assemblies can be configured either in a single-in-line package (SIP) where all of the leads protrude from one side of the package, or in a dual-in-line package (DIP) where all of the leads protrude from two sides of the package. When switching from a dual-in-line package to a single-in-line package, semiconductor components and electrical routing need to undergo a complete redesign, which requires reconfiguration of the entire package, thus increasing manufacturing cost, time and complexity.

Accordingly, there is a need to overcome the drawbacks and deficiencies in the art by providing a highly adaptable leadframe package that allows an easy conversion from a dual-in-line package to a single-in-line package.

SUMMARY

The present disclosure is directed to an adaptable molded leadframe package and related method, substantially as shown in and/or described in connection with at least one of the figures, and as set forth in the claims.

BRIEF DESCRIPTION OF THE DRAWINGS

FIG. 3A illustrates a cross sectional view of a portion of a dual-in-line semiconductor package according to one implementation of the present application.

FIG. 3B illustrates a cross sectional view of a portion of a dual-in-line semiconductor package according to one implementation of the present application.

FIG. 3C illustrates a cross sectional view of a portion of a dual-in-line semiconductor package according to one implementation of the present application.

FIG. 3D illustrates a cross sectional view of a portion of a dual-in-line semiconductor package according to one implementation of the present application.

FIG. 5A illustrates a cross sectional view of a portion of a dual-in-line semiconductor package according to one implementation of the present application.

FIG. 5B illustrates a cross sectional view of a portion of a dual-in-line semiconductor package according to one implementation of the present application.

FIG. 5C illustrates a cross sectional view of a portion of a dual-in-line semiconductor package according to one implementation of the present application.

FIG. 5D illustrates a cross sectional view of a portion of a dual-in-line semiconductor package according to one implementation of the present application.

FIG. 6A illustrates a cross sectional view of a portion of a single-in-line semiconductor package according to one implementation of the present application.

FIG. 6B illustrates a cross sectional view of a portion of a single-in-line semiconductor package according to one implementation of the present application.

FIG. 6C illustrates a cross sectional view of a portion of a single-in-line semiconductor package according to one implementation of the present application.

FIG. 6D illustrates a cross sectional view of a portion of a single-in-line semiconductor package according to one implementation of the present application.

DETAILED DESCRIPTION

Figure 1A:
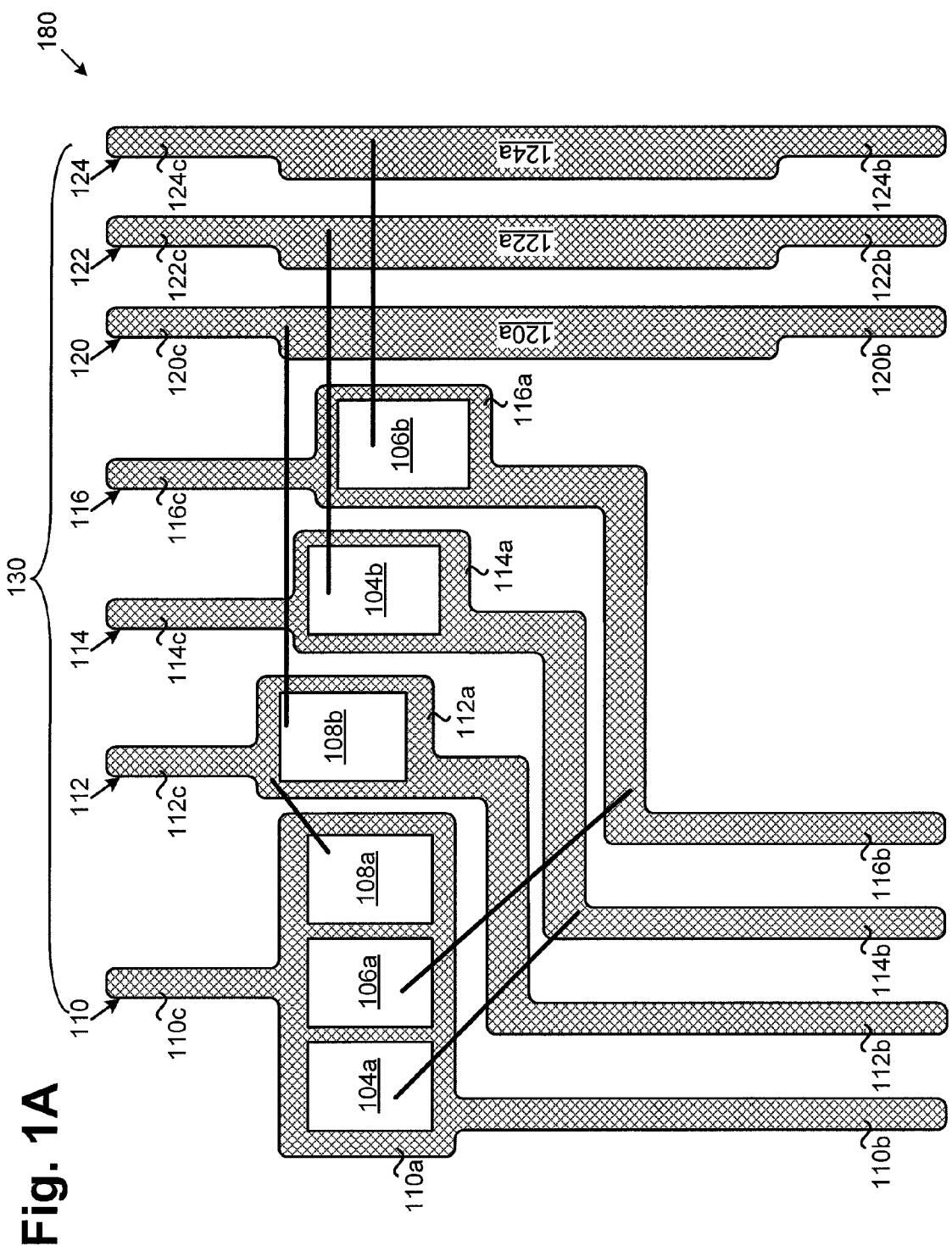
FIG. 1A illustrates a top plan view of a portion of a semiconductor package processed in accordance with an initial processing action according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1A, FIG. 1A illustrates a top plan view of a portion of a semiconductor package processed in accordance with an initial processing action according to one implementation of the present application. For example, the initial processing action includes disposing at least one semiconductor device on a continuous conductive structure having a leadframe island coupled to a first lead and a second lead.

As illustrated in FIG. 1A, structure 180 includes leadframe 130 having continuous conductive structures 110, 112, 114, 116, 120, 122 and 124, and semiconductor devices 104a, 106a and 108a situated on continuous conductive structure 110, semiconductor device 108b situated on continuous conductive structure 112, semiconductor device 104b situated on continuous conductive structure 114, and semiconductor device 106b situated on continuous conductive structure 116.

As illustrated in FIG. 1A, each of continuous conductive structures 110, 112, 114, 116, 120, 122 and 124 includes a leadframe island and a pair of leads coupled to the leadframe island on opposing sides thereof. For example, continuous conductive structure 110 includes leads 110b and 110c coupled to leadframe island 110a, where leads 110b and 110c extend from opposing sides of leadframe island 110a to form a continuous conductive path for at least one of semiconductor devices 104a, 106a and 108a. Continuous conductive structure 112 includes leads 112b and 112c coupled to leadframe island 112a, where leads 112b and 112c extend from opposing sides of leadframe island 112a to form a continuous conductive path for semiconductor device 108b. Continuous conductive structure 114 includes leads 114b and 114c coupled to leadframe island 114a, where leads 114b and 114c extend from opposing sides of leadframe island 114a to form a continuous conductive path for semiconductor device 104b. Continuous conductive structure 116 includes leads 116b and 116c coupled to leadframe island 116a, where leads 116b and 116c extend from opposing sides of leadframe island 116a to form a continuous conductive path for semiconductor device 106b. Similarly, continuous conductive structures 120, 122 and 124 each include a leadframe island (e.g., leadframe islands 120a, 122a and 124a, respectively) and a pair of leads (e.g., leads 120b and 120c, leads 122b and 122c, and leads 124b and 124c, respectively) extending from opposing sides of the leadframe island. In one implementation, continuous conductive structures 110, 112, 114, 116, 120, 122 and 124 of leadframe 130 each include conductive material, such as copper or copper alloy.

As illustrated in FIG. 1A, semiconductor devices 104a, 106a and 108a are situated on leadframe island 110a of continuous conductive structure 110. In one implementation, semiconductor devices 104a, 106a and 108a each include at least one terminal (not explicitly shown in FIG. 1A) on their respective top surfaces and at least one terminal (not explicitly shown in FIG. 1A) on their respective bottom surfaces. For example, the respective bottom terminals of semiconductor devices 104a, 106a and 108a are electrically coupled to leadframe island 110a of continuous conductive structure 110, which provides a conductive path between lead 110b, lead 110c and the bottom terminals through leadframe island 110a. The construction of continuous conductive structure 110 allows semiconductor devices 104a, 106a and 108a to continue to function even when one of leads 110b and 110c is removed (e.g., trimmed) from continuous conductive structure 110.

As illustrated in FIG. 1A, semiconductor device 108b is situated on leadframe island 112a of continuous conductive structure 112. Semiconductor device 108b includes at least one terminal on a bottom surface thereof and electrically coupled to leadframe island 112a of continuous conductive structure 112, which provides a conductive path between lead 112b, lead 112c and the bottom terminal through leadframe island 112a. Semiconductor device 104b is situated on leadframe island 114a of continuous conductive structure 114. Semiconductor device 104b includes at least one terminal on a bottom surface thereof and electrically coupled to leadframe island 114a of continuous conductive structure 114, which provides a conductive path between lead 114b, lead 114c and the bottom terminal through leadframe island 114a. Semiconductor device 106b is situated on leadframe island 116a of continuous conductive structure 116. Semiconductor device 106b includes at least one terminal on a bottom surface thereof and electrically coupled to leadframe island 116a of continuous conductive structure 116, which provides a conductive path between lead 116b, lead 116c and the bottom terminal through leadframe island 116a. Similar to continuous conductive structure 110, continuous conductive structures 112, 114 and 116 allow semiconductor devices 108b, 104b and 106b, respectively, to continue to function even when one of their respective leads is removed (e.g., trimmed).

As illustrated in FIG. 1A, the terminals of the respective top surfaces of semiconductor devices 104a, 106a and 108a are electrically coupled to lead 114b, lead 116b and leadframe island 112a, respectively, by bond wires. The terminals on the respective top surfaces of semiconductor devices 104b, 106b and 108b are electrically coupled to leadframe islands 122a, 124a and 120a, respectively, by bond wires. In one implementation, at least one of semiconductor devices 104a, 104b, 106a, 106b, 108a and 108b is a power semiconductor switch, such as a power metal-oxide-semiconductor field effect transistor (MOSFET), an insulated gate bipolar transistor (IGBT), a high electron mobility transistor (HEMT) (e.g., a gallium nitride or silicon carbide HEMT) or a diode.

Figure 1B:
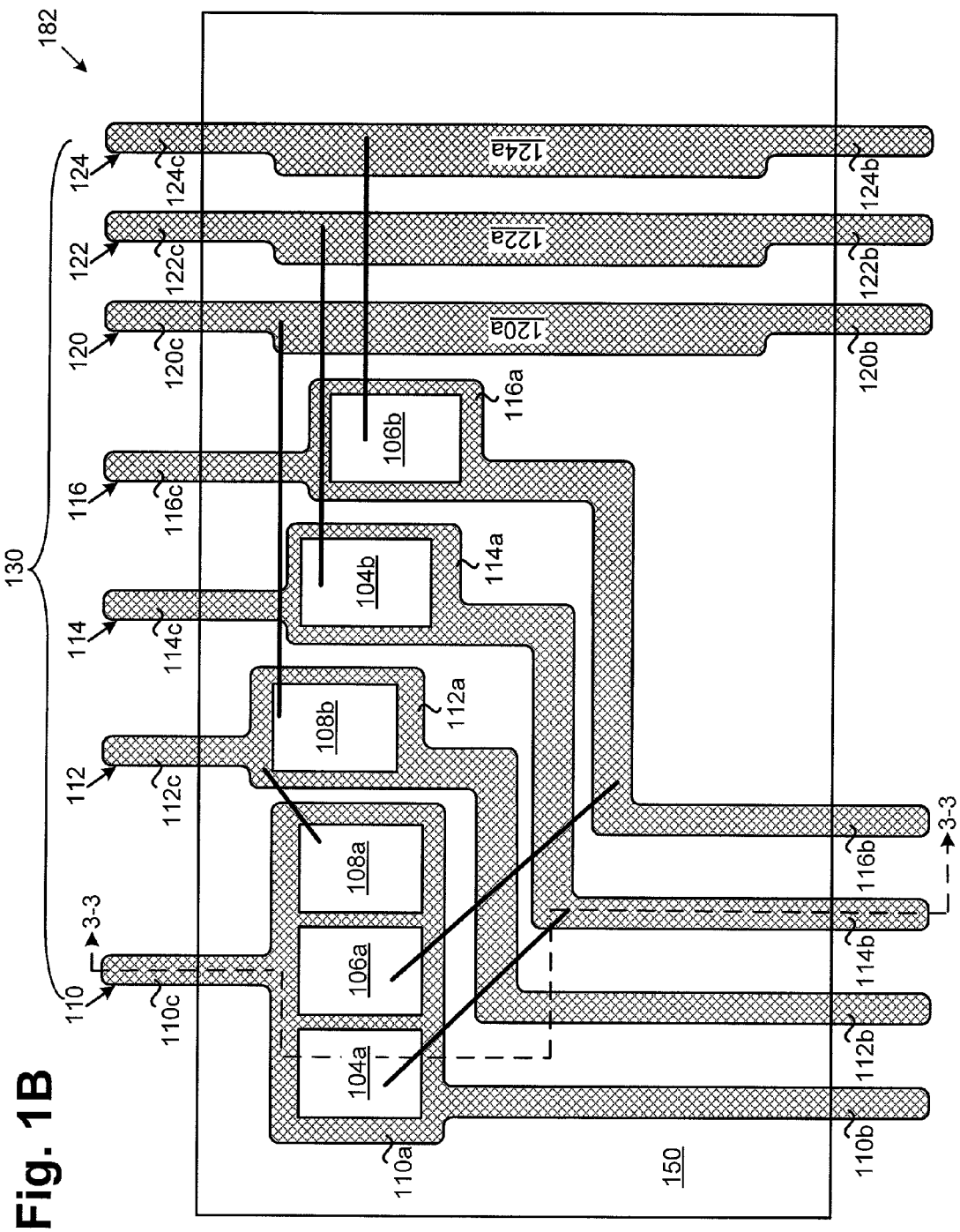
FIG. 1B illustrates a top plan view of a portion of a semiconductor package processed in accordance with an intermediate processing action according to one implementation of the present application.

Referring to FIG. 1B, FIG. 1B illustrates a top plan view of a portion of a semiconductor package processed in accordance with an intermediate processing action according to one implementation of the present application. For example, the intermediate processing action includes encapsulating the at least one semiconductor device and the continuous conductive structure such that the first lead protrudes from one side of the semiconductor package and the second lead protrudes from another side of the semiconductor package.

As illustrated in FIG. 1B, structure 182 includes encapsulant 150 covering semiconductor devices 104a, 104b, 106a, 106b, 108a and 108b, and continuous conductive structures 110, 112, 114, 116, 120, 122 and 124. For example, encapsulant 150 covers leadframe islands 110a, 112a, 114a, 116a, 120a, 122a and 124a of continuous conductive structures 110, 112, 114, 116, 120, 122 and 124, respectively. Encapsulant 150 also covers portions of leads 110b, 112b, 114b, 116b, 120b, 122b and 124b on one side of leadframe 130, and portions of leads 110c, 112c, 114c, 116c, 120c, 122c and 124c on another side of leadframe 130.

In the present implementation, encapsulant 150 includes a mold compound, such as a plastic with a low flexural modulus. In one implementation, encapsulant 150 may include a high thermal conductive mold compound to achieve high voltage isolation. It should be noted that, during the molding process, leadframe 130 is suspended from both sides of structure 182. Having leads suspended on both sides can improve the stability of leadframe 130 during the molding process, thereby allowing better control of the thickness of encapsulant 150.

It is noted that after encapsulation, structure 182 is a dual-in-line semiconductor package, such as a molded dual-in-line leadframe package. As can be seen in FIG. 1B, in structure 182, each of continuous conductive structures 110, 112, 114, 116, 120, 122 and 124 traverses the entire width of the semiconductor package, and has leads protruding from opposing sides of the semiconductor package to provide electrical connections to corresponding semiconductor devices on both sides. For example, continuous conductive structure 110 has leads 110b and 110c protruding from opposing sides of encapsulant 150 of the dual-in-line semiconductor package. Lead 110b is configured to provide electrical connection to at least one of semiconductor devices 104a, 106a and 108a on one side of the dual-in-line semiconductor package. Lead 110c is configured to provide electrical connection to at least one of semiconductor devices 104a, 106a and 108a on another side of the dual-in-line semiconductor package. The construction of continuous conductive structure 110 allows at least one of semiconductor devices 104a, 106a and 108a on leadframe island 110a to continue to function even when one of leads 110b and 110c is removed (e.g., trimmed) from continuous conductive structure 110. Similarly, each of continuous conductive structures 112, 114, 116, 120, 122 and 124 also has leads protruding from opposing sides of encapsulant 150 of the dual-in-line semiconductor package. Thus, continuous conductive structures 112, 114 and 116 allow semiconductor devices 108b, 104b and 106b, respectively, to continue to function even when one of their respective leads is removed (e.g., trimmed).

Figure 1C:
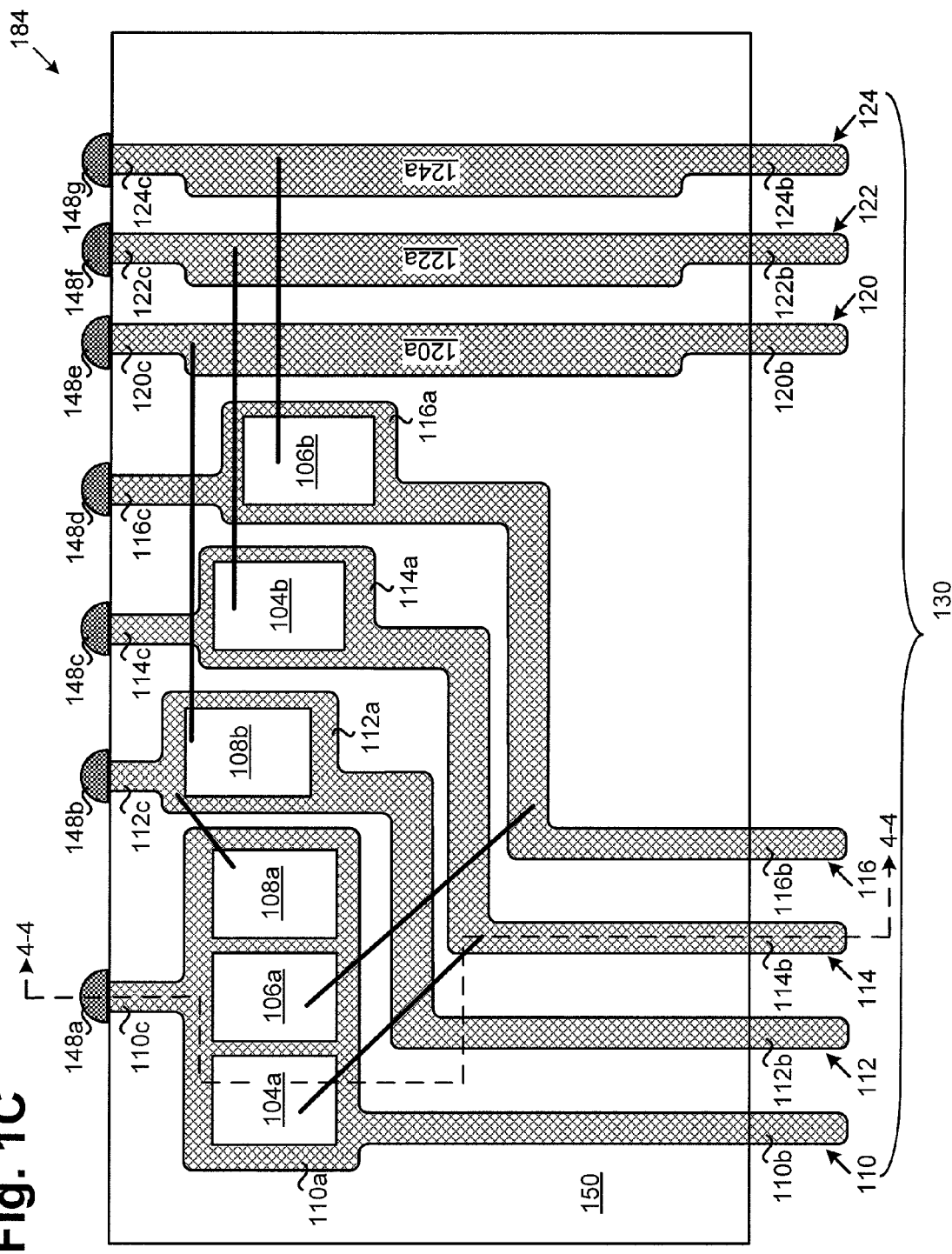
FIG. 1C illustrates a top plan view of a portion of a semiconductor package processed in accordance with a final processing action according to one implementation of the present application.

Referring to FIG. 1C, FIG. 1C illustrates a top plan view of a portion of a semiconductor package processed in accordance with a final processing action according to one implementation of the present application. For example, the final processing action includes removing, for example, by trimming one of the first and second leads from the semiconductor package.

As illustrated in FIG. 1C, portions of leads 110c, 112c, 114c, 116c, 120c, 122c, and 124c protruding from one side of structure 182 in FIG. 1B are removed by, for example, trimming or cutting. Because continuous conductive structures 110, 112, 114, 116, 120, 122 and 124 each have two leads electrically coupled to and extending from a leadframe island to form a continuous electrical path for their corresponding semiconductor devices, after trimming the leads on one side of the semiconductor package, the semiconductor devices can continue to function by using the remaining leads on the opposite side of the semiconductor package for electrical connection.

As illustrated in FIG. 1C, a portion of lead 110c of continuous conductive structure 110 protruding from encapsulant 150 is removed, and optionally insulated by insulation cap 148a, such that no electrical connection may be made to lead 110c from outside of the semiconductor package. Since continuous conductive structure 110 still has lead 110b electrically coupled to and extending from leadframe island 110a, semiconductor devices 104a, 106a and 108a can rely on leadframe island 110a and lead 110b for electrical connection and continue to function properly after trimming lead 110c. Similarly, semiconductor device 104b can rely on leadframe island 114a and lead 114b of continuous conductive structure 114 for electrical connection and continue to function properly after trimming lead 114c; semiconductor device 106b can rely on leadframe island 116a and lead 116b of continuous conductive structure 116 for electrical connection and continue to function properly after trimming lead 116c; semiconductor device 108b can rely on leadframe island 112a and lead 112b of continuous conductive structure 112 for electrical connection and continue to function properly after trimming lead 112c.

In one implementation, after trimming, the trimmed leads 110c, 112c, 114c, 116c, 120c, 122c and 124c each have an exposed surface. In another implementation, as illustrated in FIG. 1C, after trimming portions of leads 110c, 112c, 114c, 116c, 120c, 122c and 124c, insulation caps 148a, 148b, 148c, 148d, 148e, 148f and 148g are optionally disposed on the exposed surfaces of the trimmed leads 110c, 112c, 114c, 116c, 120c, 122c and 124c, respectively, such that no electrical connection can be made to the trimmed leads from outside of the semiconductor package.

It is noted that, after trimming, structure 184 is converted from the dual-in-line semiconductor package shown in FIG. 1B to a single-in-line semiconductor package, such as a molded single-in-line leadframe package, with leads protruding only from one side of structure 184. As can be seen in FIG. 1C, in structure 184, after trimming the portions of leads 110c, 112c, 114c, 116c, 120c, 122c and 124c protruding from encapsulant 150, the remaining portions of leads 110c, 112c, 114c, 116c, 120c, 122c and 124c covered by encapsulant 150 stay intact in structure 184, which would not be present in conventional SIP packages. The reason why the remaining portions of leads 110c, 112c, 114c, 116c, 120c, 122c and 124c would not be present in conventional SIP packages is that conventional SIP packages only require leads protruding from one side the package. Thus, only one lead would extend from a conductive structure and protrude from one side of the conventional SIP package, and would not traverse the entire width of the conventional SIP package. By contrast, in the present implementation, with the presence of the remaining portions of leads 110c, 112c, 114c, 116c, 120c, 122c and 124c, each of respective continuous conductive structures 110, 112, 114, 116, 120, 122 and 124 traverses the entire width of the semiconductor package, and has leads protruding from one side of the semiconductor package for electrical connection. Among other advantages, continuous conductive structures 110, 112, 114, 116, 120, 122 and 124, each having leads extending from two opposite sides of a leadframe island, allow for an easy conversion from a dual-in-line semiconductor package to a single-in-line semiconductor package without reconfiguring the internal structure (e.g., arrangements of the semiconductor components or related electrical routing paths) of the leadframe package, thereby substantially reduce manufacturing time, cost and complexity.

Although FIG. 1C shows trimming of portions of leads 110c, 112c, 114c, 116c, 120c, 122c and 124c protruding from one side of encapsulated leadframe 130, it should be understood that, in another implementation, the trimming can be performed on the opposite side of structure 184 (e.g., by removing portions of leads 110b, 112b, 114b, 116b, 120b, 122b and 124b protruding from encapsulated leadframe 130), and still allows structure 184 to function as a SIP package by relying on untrimmed leads 110c, 112c, 114c, 116c, 120c, 122c and 124c for electrical connection.

Figure 2A:
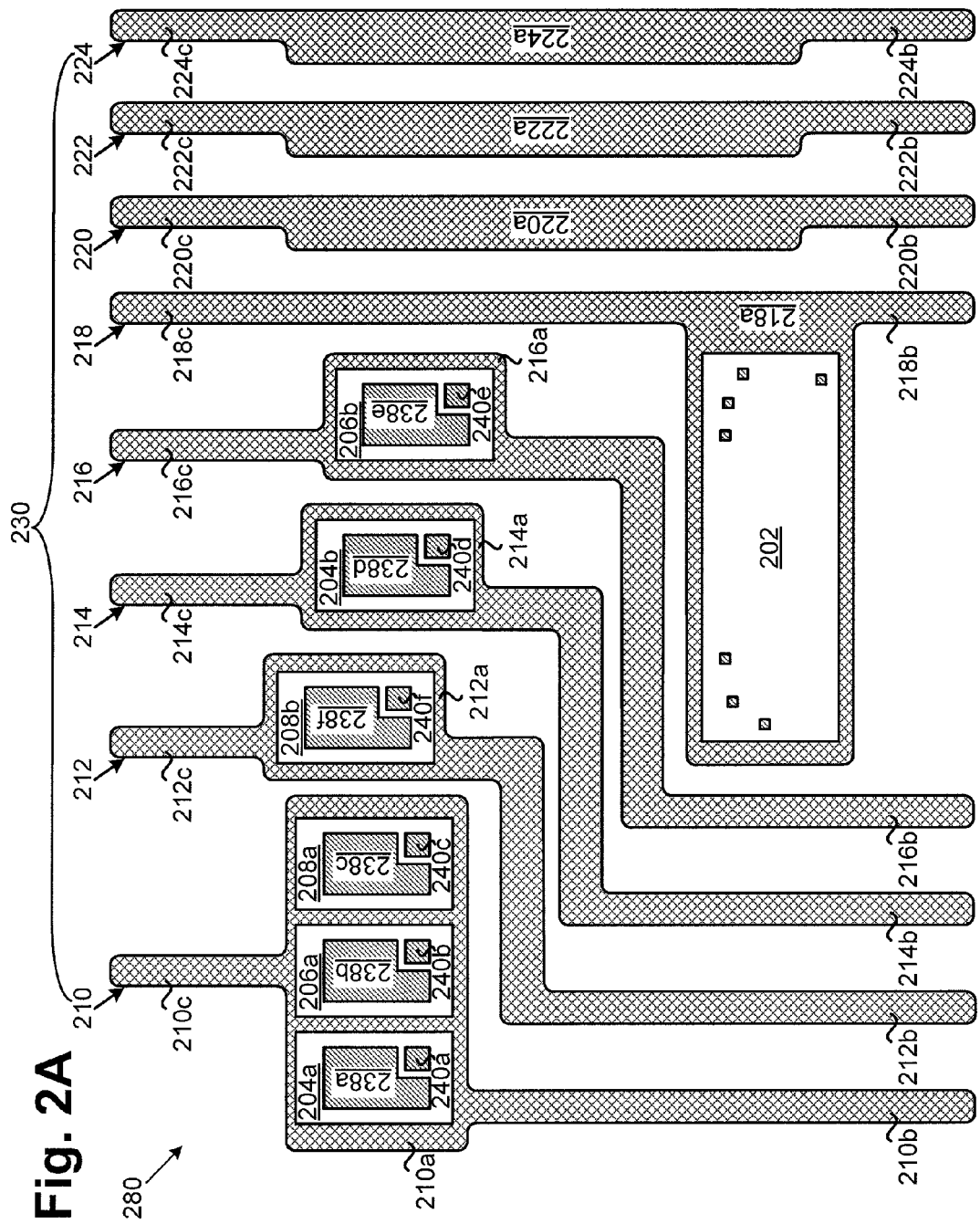
FIG. 2A illustrates a top plan view of a portion of a semiconductor package processed in accordance with an initial processing action according to one implementation of the present application.

Referring to FIG. 2A, FIG. 2A illustrates a top plan view of a portion of a semiconductor package processed in accordance with an initial processing action according to one implementation of the present application. For example, the initial processing action includes disposing a first high-side power switch of a multi-phase inverter on a first high-side portion of a leadframe, and disposing a first low-side power switch on a first low-side portion of the leadframe.

As illustrated in FIG. 2A, structure 280 includes first high-side power switch 204a, second high-side power switch 206a and third high-side power switch 208a situated on first high-side continuous conductive structure 210 of leadframe 230, first low-side power switch 204b situated on first low-side continuous conductive structure 214 of leadframe 230, second low-side power switch 206b situated on second low-side continuous conductive structure 216 of leadframe 230, and third low-side power switch 208b situated on third low-side continuous conductive structure 212 of leadframe 230. Structure 280 also includes driver integrated circuit (IC) 202 situated on driver IC continuous conductive structure 218 of leadframe 230. In one implementation, structure 280 may be part of a high voltage (HV) multi-phase inverter.

In the present implementation, first high-side power switch 204a and first low-side power switch 204b (hereinafter collectively referred to as U-phase power switches 204), second high-side power switch 206a and second low-side power switch 206b (hereinafter collectively referred to as V-phase power switches 206), and third high-side power switch 208a and third low-side power switch 208b (hereinafter collectively referred to as W-phase power switches 208) are power semiconductor devices, which may correspond to semiconductor devices 104a, 104b, 106a, 106b, 108a and 108b in FIGS. 1A-1C. In one implementation, at least one of U-phase power switches 204, V-phase power switches 206 and W-phase power switches 208 is a power semiconductor switch, such as a power metal-oxide-semiconductor field effect transistor (MOSFET), an insulated gate bipolar transistor (IGBT), a high electron mobility transistor (HEMT) (e.g., a gallium nitride or silicon carbide HEMT) or a diode. In one implementation, at least one of U-phase power switches 204, V-phase power switches 206 and W-phase power switches 208 may include group IV semiconductor material, such as silicon, or group III-V semiconductor material, such as gallium nitride (GaN).

In the present implementation, first high-side power switch 204a includes power terminal 238a (e.g., a source terminal) and control terminal 240a (e.g., a gate terminal) on a top surface thereof, and another power terminal (e.g., a drain terminal), not explicitly shown in FIG. 2A, on a bottom surface thereof. Second high-side power switch 206a includes power terminal 238b (e.g., a source terminal) and control terminal 240b (e.g., a gate terminal) on a top surface thereof, and another power terminal (e.g., a drain terminal), not explicitly shown in FIG. 2A, on a bottom surface thereof. Third high-side power switch 208a includes power terminal 238c (e.g., a source terminal) and control terminal 240c (e.g., a gate terminal) on a top surface thereof, and another power terminal (e.g., a drain terminal), not explicitly shown in FIG. 2A, on a bottom surface thereof.

First low-side power switch 204b includes power terminal 238d (e.g., a source terminal) and control terminal 240d (e.g., a gate terminal) on a top surface thereof, and another power terminal (e.g., a drain terminal), not explicitly shown in FIG. 2A, on a bottom surface thereof. Second low-side power switch 206b includes power terminal 238e (e.g., a source terminal) and control terminal 240e (e.g., a gate terminal) on a top surface thereof, and another power terminal (e.g., a drain terminal), not explicitly shown in FIG. 2A, on a bottom surface thereof. Third low-side power switch 208b includes power terminal 238f (e.g., a source terminal) and control terminal 240f (e.g., a gate terminal) on a top surface thereof, and another power terminal (e.g., a drain terminal), not explicitly shown in FIG. 2A, on a bottom surface thereof.

In the present implementation, driver IC 202 can be a high voltage IC (HVIC) for driving a high voltage (HV) multi-phase inverter, where the HV multi-phase inverter includes a U-phase having first high-side power switch 204a and first low-side power switch 204b, a V-phase having second high-side power switch 206a and second low-side power switch 206b, and a W-phase having third high-side power switch 208a and third low-side power switch 208b. Driver IC 202 is configured to provide drive signals to the respective gates of U-phase power switches 204, V-phase power switches 206, and W-phase power switches 208, for example.

As illustrated in FIG. 2A, each of continuous conductive structures 210, 212, 214, 216, 218, 220, 222 and 224 includes a leadframe island and a pair of leads coupled to the leadframe island on opposing sides thereof. For example, first high-side continuous conductive structure 210 of leadframe 230 includes leadframe island 210a and leads 210b and 210c extending from opposing sides of leadframe island 210a to form a continuous conductive path for at least one of first high-side power switch 204a, second high-side power switch 206a and third high-side power switch 208a. First low-side continuous conductive structure 214 of leadframe 230 includes leadframe island 214a and leads 214b and 214c extending from opposing sides of leadframe island 214a to form a continuous conductive path for first low-side power switch 204b. Second low-side continuous conductive structure 216 of leadframe 230 includes leadframe island 216a and leads 216b and 216c extending from opposing sides of leadframe island 216a to form a continuous conductive path for second low-side power switch 206b. Third low-side continuous conductive structure 212 of leadframe 230 includes leadframe island 212a and leads 212b and 212c extending from opposing sides of leadframe island 212a to form a continuous conductive path for third low-side power switch 208b. Driver IC continuous conductive structure 218 of leadframe 230 includes leadframe island 218a and leads 218b and 218c extending from opposing sides of leadframe island 218a to form a continuous conductive path for driver IC 202. In addition, continuous conductive structure 220 includes leadframe island 220a and leads 220b and 220c extending from opposing sides of leadframe island 220a. Continuous conductive structure 222 includes leadframe island 222a and leads 222b and 222c extending from opposing sides of leadframe island 222a. Continuous conductive structure 224 includes leadframe island 224a and leads 224b and 224c extending from opposing sides of leadframe island 224a. In one implementation, first high-side continuous conductive structure 210, first low-side continuous conductive structure 214, second low-side continuous conductive structure 216, third low-side continuous conductive structure 212, driver IC continuous conductive structure 218, and continuous conductive structures 220, 222 and 224 of leadframe 230 each include conductive material, such as copper or copper alloy.

First high-side power switch 204a, second high-side power switch 206a, and third high-side power switch 208a are electrically and mechanically connected to leadframe island 210a of first high-side continuous conductive structure 210 by, for example, utilizing solder or conductive adhesive. First low-side power switch 204b is electrically and mechanically connected to leadframe island 214a of first low-side continuous conductive structure 214 by, for example, utilizing solder or conductive adhesive. Second low-side power switch 206b is electrically and mechanically connected to leadframe island 216a of second low-side continuous conductive structure 216 by, for example, utilizing solder or conductive adhesive. Third low-side power switch 208b is electrically and mechanically connected to leadframe island 212a of third low-side continuous conductive structure 212 by, for example, utilizing solder or conductive adhesive.

In the present implementation, first high-side power switch 204a, second high-side power switch 206a, and third high-side power switch 208a are situated on leadframe island 210a of first high-side continuous conductive structure 210. In another implementation, first high-side power switch 204a, second high-side power switch 206a, and third high-side power switch 208a can be situated on separate continuous conductive structures (e.g., a first high-side continuous conductive structure, a second high-side continuous conductive structure and a third high-side continuous conductive structure) of leadframe 230.

Because first high-side continuous conductive structure 210, first low-side continuous conductive structure 214, second low-side continuous conductive structure 216, third low-side continuous conductive structure 212, driver IC continuous conductive structure 218, and continuous conductive structures 220, 222 and 224 each have a leadframe island and two leads extending from opposing sides of the leadframe island, electrically connections can be made on both sides of leadframe 230 for at least one terminal of each power switch and driver IC. For example, leads 210b and 210c of first high-side continuous conductive structure 210 can be coupled to a bus voltage, VBUS, to supply a bus voltage to the respective drains of first high-side power switch 204a, second high-side power switch 206a, and third high-side power switch 208a. Leads 214b and 214c of first low-side continuous conductive structure 214 can be coupled to a switched node between first high-side power switch 204a and first low-side power switch 204b. Leads 216b and 216c of second low-side continuous conductive structure 216 can be coupled to a switched node between second high-side power switch 206a and second low-side power switch 206b. Leads 212b and 212c of third low-side continuous conductive structure 212 can be coupled to a switched node between third high-side power switch 208a and third low-side power switch 208b. Leads 218b and 218c of driver IC continuous conductive structure 218 can be coupled to an input, INPUT, for driver IC 202. Leads 220b and 220c of continuous conductive structure 220, leads 222b and 222c, of continuous conductive structure 222, and leads 224b and 224c of continuous conductive structure 224 can be respectively coupled to corresponding source terminals of third high-side power switch 208b, first low-side power switch 204b, and second low-side power switch 206b.

The construction of first high-side continuous conductive structure 210 allows at least one of high-side power switches 204a, 206a and 208a to continue to function even when one of leads 210b and 210c is removed (e.g., trimmed) from first high-side continuous conductive structure 210. Similar, continuous conductive structures 212, 214, 216 and 218 allow low-side power switches 208b, 204b and 206b and driver IC 202, respectively, to continue to function even when one of their respective leads is removed (e.g., trimmed). As will be discussed in detail below with reference to FIGS. 2C and 2D, leadframe 230 can allow an easy conversion from a DIP to a SIP package.

Figure 2B:
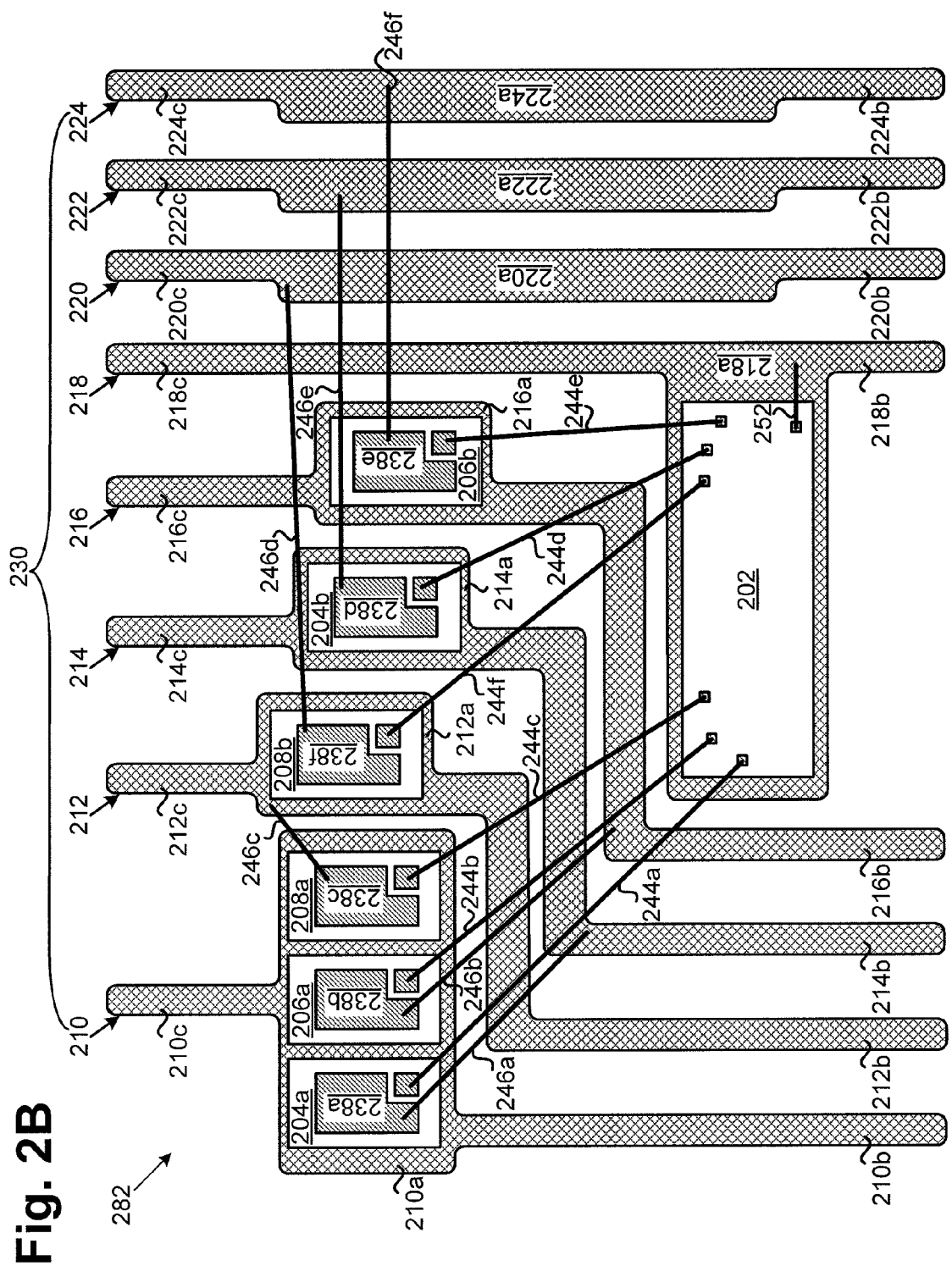
FIG. 2B illustrates a top plan view of a portion of a semiconductor package processed in accordance with an intermediate processing action according to one implementation of the present application.

Referring to FIG. 2B, structure 282 illustrates a top plan view of a portion of a semiconductor package processed in accordance with an intermediate processing action according to one implementation of the present application. For example, the intermediate processing action includes coupling the first high-side power switch to the first low-side power switch.

As illustrated in FIG. 2B, structure 282 includes first high-side power switch 204a, second high-side power switch 206a and third high-side power switch 208a situated on first high-side continuous conductive structure 210 of leadframe 230, first low-side power switch 204b situated on first low-side continuous conductive structure 214 of leadframe 230, second low-side power switch 206b situated on second low-side continuous conductive structure 216 of leadframe 230, and third low-side power switch 208b situated on third low-side continuous conductive structure 212 of leadframe 230. Structure 282 also includes driver IC 202 situated on driver IC continuous conductive structure 218 of leadframe 230.

As illustrated in FIG. 2B, driver IC 202 is coupled to leadframe island 218a of driver IC continuous conductive structure 218 for receiving an input signal, for example. Driver IC 202 is also coupled to control terminals 240a, 240b, 240c, 240d, 240e and 240f of respective first high-side power switch 204a, second high-side power switch 206a, third high-side power switch 208a, first low-side power switch 204b, second low-side power switch 206b and third low-side power switch 208b, though bond wires 244a, 244b, 244c, 244d, 244e and 244f, respectively.

As illustrated in FIG. 2B, power terminal 238a (e.g., a source terminal) of first high-side power switch 204a is electrically coupled to lead 214b of first low-side continuous conductive structure 214 through bond wire 246a, where lead 214b is electrically and mechanically coupled to a power terminal (e.g., a drain terminal) of first low-side power switch 204b. As a result, first high-side power switch 204a and first low-side power switch 204b are connected in a half-bridge configuration, and form one phase, (e.g., a U phase) of a multi-phase inverter. As illustrated in FIG. 2B, power terminal 238b (e.g., a source terminal) of second high-side power switch 206a is electrically coupled to lead 216b of second low-side continuous conductive structure 216 through bond wire 246b, where lead 216b is electrically and mechanically coupled to a power terminal (e.g., a drain terminal) of second low-side power switch 206b. As a result, second high-side power switch 206a and second low-side power switch 206b are connected in a half-bridge configuration, and form one phase, (e.g., a V phase) of the multi-phase inverter. As illustrated in FIG. 2B, power terminal 238c (e.g., a source terminal) of third high-side power switch 208a is electrically coupled to leadframe island 212a of third low-side continuous conductive structure 212 through bond wire 246c, where leadframe island 212a is electrically and mechanically coupled to a power terminal (e.g., a drain terminal) of third low-side power switch 208b. As a result, third high-side power switch 208a and third low-side power switch 208b are connected in a half-bridge configuration, and form one phase, (e.g., a W phase) of the multi-phase inverter.

As illustrated in FIG. 2B, power terminal 238d (e.g., a source terminal) of first low-side power switch 204b is electrically coupled to leadframe island 222a of continuous conductive structure 222 through bond wire 246e. Power terminal 238e (e.g., a source terminal) of second low-side power switch 206b is electrically coupled to leadframe island 224a of continuous conductive structure 224 through bond wire 246f. Power terminal 238f (e.g., a source terminal) of third low-side power switch 208b is electrically coupled to leadframe island 220a of continuous conductive structure 220 through bond wire 246d.

In the present implementation, bond wires 244a-244f, 246a-246f and 252 can include conductive material, such as aluminum, gold or copper. Bond wires 244a-244f and 252 may each have a diameter in a range between 1.3-2 mils (i.e., $10^{-3}$ inches). Bond wires 246a-246f may each have a diameter in a range between 2-20 mils (i.e., $10^{-3}$ inches). In another implementation, bond wires 244a-244f, 246a-246f and 252 can take forms of conductive ribbons for enhanced current carrying capacity.

Figure 2C:
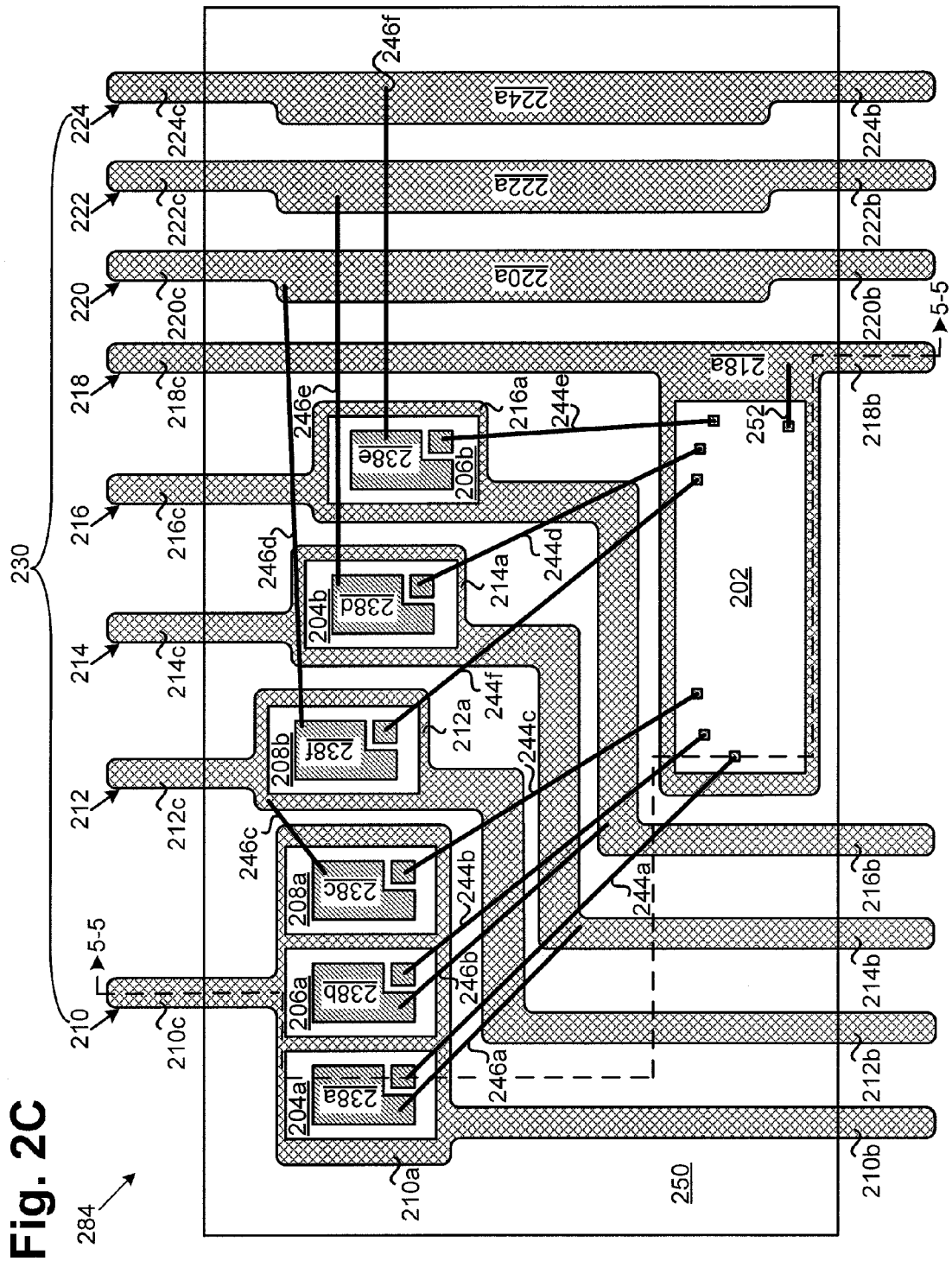
FIG. 2C illustrates a top plan view of a portion of a semiconductor package processed in accordance with an intermediate processing action according to one implementation of the present application.

Referring to FIG. 2C, structure 284 illustrates a top plan view of a portion of a semiconductor package processed in accordance with an intermediate processing action according to one implementation of the present application. For example, the intermediate processing action covering the first high-side power switch and the first low-side power switch with an encapsulant. In the present implementation, structure 284 is a dual-in-line semiconductor package, such as a molded dual-in-line leadframe package with leads protruding from two opposing sides of structure 284. As can be seen in FIG. 2C, in structure 284, each of continuous conductive structures 210, 212, 214, 216, 218, 220, 222 and 224 traverses the entire width of the semiconductor package, and has leads protruding from opposing sides of the semiconductor package for electrical connection. Thus, the dual-in-line semiconductor package offers access to various input and outputs on two sides of structure 284.

As illustrated in FIG. 2C, structure 284 includes encapsulant 250 covering first high-side power switch 204a, second high-side power switch 206a, third high-side power switch 208a, first low-side power switch 204b, second low-side power switch 206b and third low-side power switch 208b. Encapsulant 250 covers leadframe islands 210a, 212a, 214a, 216a, 218a, 220a, 222a and 224a of leadframe 230. Encapsulant 250 also covers portions of leads 210b, 212b, 214b, 216b, 218b, 220b, 222b and 224b on one side of leadframe 230, and portions of leads 210c, 212c, 214c, 216c, 218c, 220c, 222c and 224c on another side of leadframe 230. In addition, encapsulant 250 also covers bond wires 244a-244f, 246a-246f and 252. In the present implementation, encapsulant 250 includes a mold compound, such as a plastic with a low flexural modulus. In one implementation, encapsulant 250 may include a high thermal conductive mold compound to achieve high voltage isolation. It should be noted that, during the molding process, leadframe 230 is suspended from both sides of structure 284. Having leads suspended on both sides can improve the stability of leadframe 230 during the molding process, thereby allowing better control of the thickness of encapsulant 250.

Figure 2D:
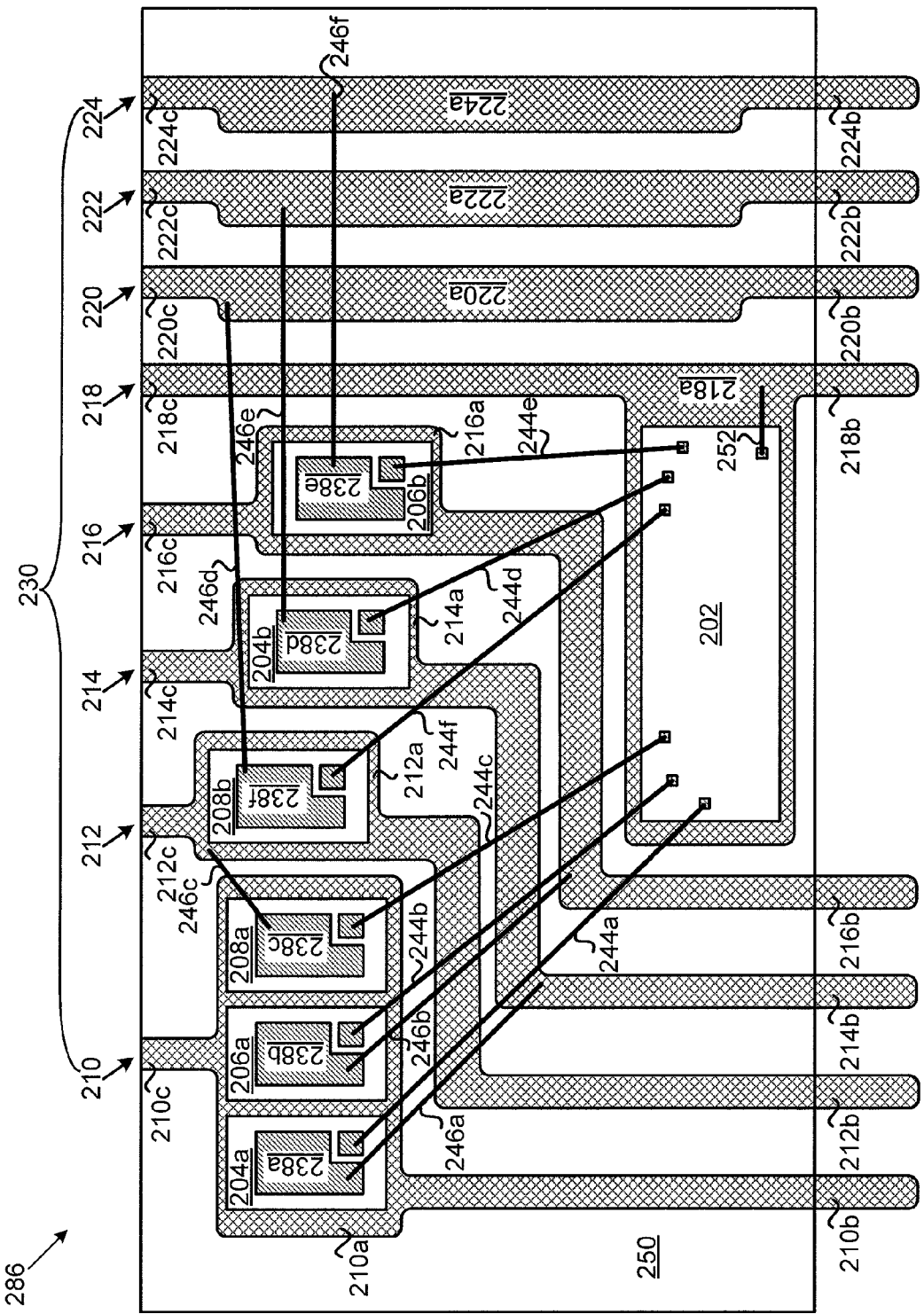
FIG. 2D illustrates a top plan view of a portion of a semiconductor package processed in accordance with a final processing action according to one implementation of the present application.

Referring to FIG. 2D, structure 286 illustrates a top plan view of a portion of a semiconductor package processed in accordance with a final processing action according to one implementation of the present application. For example, the final processing action includes removing one or more leads protruding from one side of the semiconductor package.

As illustrated in FIG. 2D, portions of leads 210c, 212c, 214c, 216c, 218c, 220c, 222c and 224c protruding from one side of encapsulated leadframe 230 in FIG. 2C are removed by, for example, trimming or cutting. As illustrated in FIG. 2D, after trimming, structure 286 is converted from the dual-in-line semiconductor package shown in FIG. 2C to a single-in-line semiconductor package, such as a molded single-in-line leadframe package, with leads protruding only from one side of structure 286. As can be seen in FIG. 2D, in structure 286, after trimming the portions of leads 210c, 212c, 214c, 216c, 218c, 220c, 222c and 224c protruding from encapsulant 250, the remaining portions of leads 210c, 212c, 214c, 216c, 218c, 220c, 222c and 224c covered by encapsulant 250 stay intact in structure 286, which would not be present in conventional SIP packages. The reason why the remaining portions of leads 210c, 212c, 214c, 216c, 218c, 220c, 222c and 224c would not be present in conventional SIP packages is that conventional SIP packages only require leads protruding from one side the package. Thus, only one lead would extend from a conductive structure and protrude from one side of the conventional SIP package, and would not traverse the entire width of the conventional SIP package. By contrast, in the present implementation, with the presence of the remaining portions of leads 210c, 212c, 214c, 216c, 218c, 220c, 222c and 224c, each of respective continuous conductive structures 210, 212, 214, 216, 218, 220, 222 and 224 traverses the entire width of the semiconductor package, and has leads protruding from one side of the semiconductor package for electrical connection. Also, because continuous conductive structures 210, 212, 214, 216, 218, 220, 222 and 224 each have two leads electrically coupled to and extending from a leadframe island to form a continuous electrical path for their corresponding semiconductor devices, after trimming the leads on one side of the semiconductor package, the semiconductor devices can continue to function by replying on the remaining leads on the opposite side of the semiconductor package for electrical connection. As illustrated in FIG. 2D, after trimming, each of continuous conductive structures 210, 212, 214, 216, 218, 220, 222 and 224 traverses the entire width of the semiconductor package, and has respective leads 210b, 212b, 214b, 216b, 218b, 220b, 222b and 224b protruding from one side of the semiconductor package for electrical connection. Among other advantages, continuous conductive structures 210, 212, 214, 216, 218, 220, 222 and 224, each having leads extending from two opposite sides of a leadframe island, allow for an easy conversion from a dual-in-line semiconductor package to a single-in-line semiconductor package without reconfiguring the internal structure (e.g., arrangements of the semiconductor components or related electrical routing paths) of the leadframe package, thereby substantially reduce manufacturing time, cost and complexity. It is noted that the remaining portions of leads 210c, 212c, 214c, 216c, 218c, 220c, 222c and 224c in FIG. 2D are left exposed without electrical insulation.

Although FIG. 2D shows trimming of portions of leads 210c, 212c, 214c, 216c, 218c, 220c, 222c and 224c protruding from one side of encapsulated leadframe 230, it should be understood that, in another implementation, the trimming can be performed on the opposite side of structure 286 (e.g., by removing portions of leads 210b, 212b, 214b, 216b, 218b, 220b, 222b and 224b protruding from encapsulated leadframe 230), and still allows structure 286 to function as a SIP package by relying on untrimmed leads 210c, 212c, 214c, 216c, 218c, 220c, 222c and 224c for electrical connection.

Figure 2E:
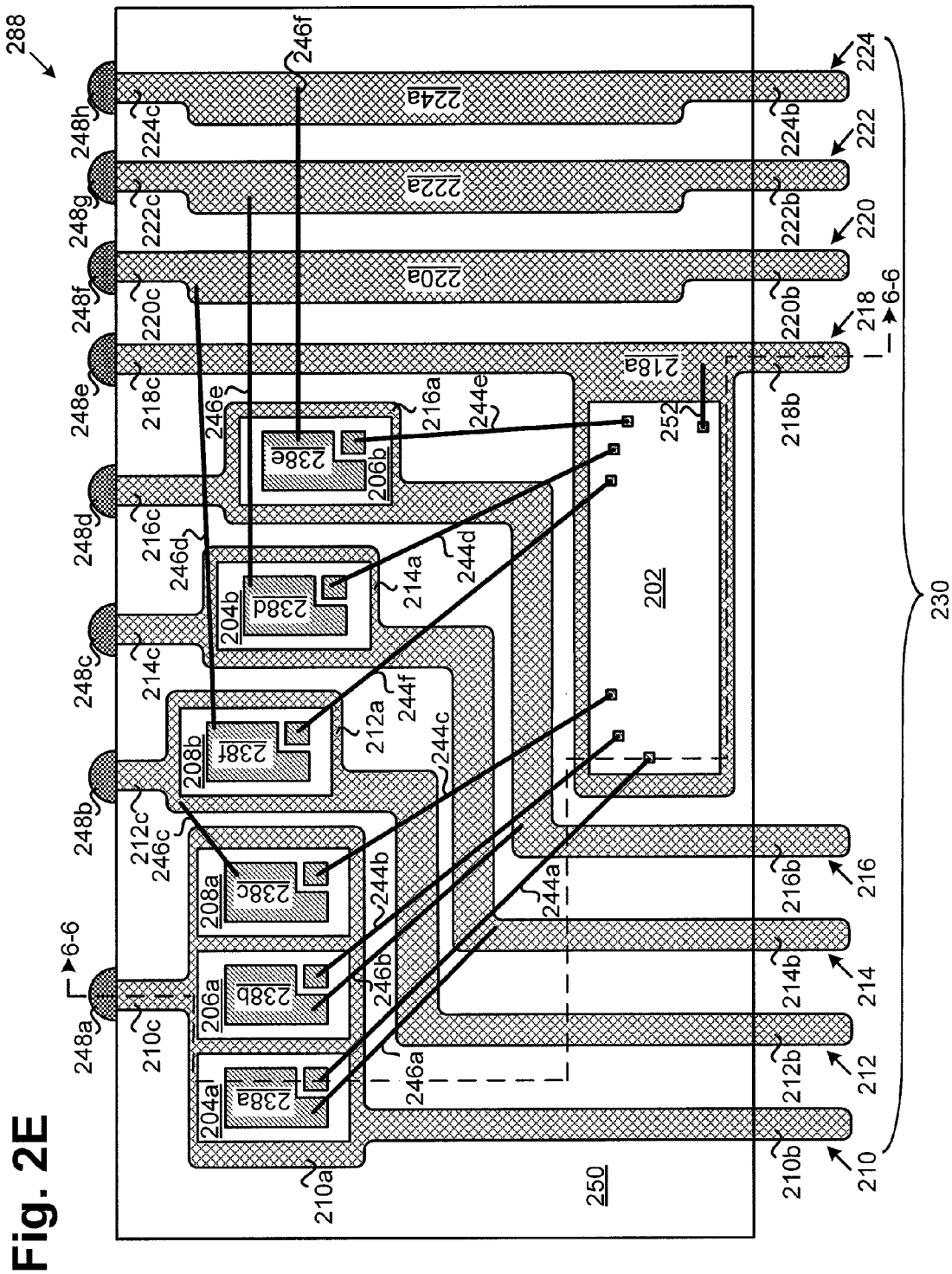
FIG. 2E illustrates a top plan view of a portion of a semiconductor package processed in accordance with an optional processing action according to one implementation of the present application.

Referring to FIG. 2E, structure 288 illustrates a top plan view of a portion of a semiconductor package processed in accordance with an optional processing action according to one implementation of the present application. For example, the optional processing action includes electrically insulating the one or more leads on the one side of the semiconductor package.

As illustrated in FIG. 2E, the exposed portions of leads 210c, 212c, 214c, 216c, 218c, 220c, 222c and 224c on one side of molded leadframe 230 are electrically insulated by insulation caps 248a, 248b, 248c, 248d, 248e, 248f, 248g and 248h, respectively. In one implementation, insulation caps 248a, 248b, 248c, 248d, 248e, 248f, 248g and 248h can include insulating material, such as dispensed epoxy, powder coating, or dielectric coating. As such, electrical connections can be made only through leads 210*b*, 212*b*, 214*b*, 216*b*, 218*b*, 220*b*, 222*b* and 224*b* on the opposing side of the semiconductor package.

Referring to FIGS. 3A, 3B, 3C and 3D, each of FIGS. 3A, 3B, 3C and 3D illustrates a cross sectional view of a portion of a dual-in-line semiconductor package according to one implementation of the present application. For example, the cross sectional view in each of FIGS. 3A, 3B, 3C and 3D may correspond to the cross section of structure 182 along line 3-3 in FIG. 1B according to one implementation of the present application. In FIGS. 3A, 3B, 3C and 3D, semiconductor device 304*a*, continuous conductive structure 310 and continuous conductive structure 314 may correspond to semiconductor device 104*a*, continuous conductive structure 110 of leadframe 130, and continuous conductive structure 114 of leadframe 130, respectively, in FIG. 1B.

As illustrated in FIGS. 3A, 3B, 3C and 3D, respective dual-in-line semiconductor packages 382A, 382B, 382C and 382D each include semiconductor device 304*a* situated on leadframe island 310*a* of continuous conductive structure 310, and coupled to lead 314*b* of continuous conductive structure 314 through a bond wire. Semiconductor device 304*a* includes terminal 338*a* on a top surface thereof, and terminal 342*a* on a bottom surface thereof. Terminal 338*a* of semiconductor device 304*a* is electrically connected to lead 314*b* of continuous conductive structure 314 through a bond wire. Terminal 342*a* of semiconductor device 304*a* is electrically and mechanically connected to leadframe island 310*a* of continuous conductive structure 310 by, for example, utilizing solder or conductive adhesive. Encapsulant 350 covers semiconductor device 304*a*, leadframe island 310*a* of continuous conductive structure 310, and portions of leads 310*c* and 314*b*, while the remaining portions of leads 310*c* and 314*b* protrude from opposing sides of the dual-in-line semiconductor package.

As illustrated in FIG. 3A, each of continuous conductive structure 310 and continuous conductive structure 314 has a substantially uniform thickness throughout an entire length thereof. In one implementation, continuous conductive structure 310 and continuous conductive structure 314 may each have a substantially uniform thickness in a range between 0.2 to 2 mm (i.e., $10^{-3}$ meters).

As illustrated in FIG. 3B, lead 314*b* of continuous conductive structure 314 includes a down-set portion which is configured to reduce the thermal resistance of dual-in-line semiconductor packages 382B, due to the reduced distance (e.g., 0.3 to 1 mm) between the bottom surface of the down-set portion of lead 314*b* and the bottom surface of encapsulant 350.

As illustrated in FIG. 3C, lead 314*b* of continuous conductive structure 314 includes a dual gauge portion, where a portion of lead 314*b* retains the full thickness of continuous conductive structure 314, while the remaining portions of lead 314*b* retain a fraction (e.g., half-etched or quarter-etched) of the full thickness of continuous conductive structure 314 of the leadframe. The full thickness portion of lead 314*b* can reduce the thermal resistance, thereby improving the thermal performance, of dual-in-line semiconductor packages 382C, due to the reduced distance between the bottom surface of the full thickness portion of lead 314*b* and the bottom surface of encapsulant 350.

As illustrated in FIG. 3D, lead 314*b* of continuous conductive structure 314 includes a dual gauge portion, where a portion of lead 314*b* retains the full thickness of continuous conductive structure 314, while the remaining portions of lead 314*b* retain a fraction (e.g., half-etched or quarter-etched) of the full thickness of continuous conductive structure 314 of the leadframe. The full thickness portion of lead 314*b* can reduce the thermal resistance, thereby improving the thermal performance, of dual-in-line semiconductor packages 382D, due to the reduced distance between the bottom surface of the full thickness portion of lead 314*b* and the bottom surface of encapsulant 350. Also, as illustrated in FIG. 3D, lead 314*b* of continuous conductive structure 314 includes a down-set portion, which can further reduce the thermal resistance of dual-in-line semiconductor packages 382D, due to the further reduced distance between the bottom surface of the down-set portion of lead 314*b* and the bottom surface of encapsulant 350. Although only continuous conductive structure 314 is shown to have a down-set portion and/or a dual gauge portion in FIGS. 3B-3D, it should be understood that each of continuous conductive structures 110, 112, 114, 116, 120, 122 and 124 of leadframe 130 in FIG. 1B may have a down-set portion and/or a dual gauge portion.

In another implementation, leadframe island 310*a* of continuous conductive structure 310 in FIGS. 3A-3D, on which semiconductor device 304*a* is situated, may also have a down-set portion and/or a dual gauge portion to improve thermal performance of semiconductor device 304*a*. Similarly, each of leadframe islands 112*a*, 114*a* and 116*a* of respective continuous conductive structures 112, 114 and 116 in FIG. 1B may also have a down-set portion and/or a dual gauge portion to improve thermal performance of respective semiconductor devices 108*b*, 104*b* and 106*b* situated thereon.

Referring to FIGS. 4A, 4B, 4C and 4D, each of FIGS. 4A, 4B, 4C and 4D illustrates a cross sectional view of a portion of a single-in-line semiconductor package according to one implementation of the present application. For example, the cross sectional view in each of FIGS. 4A, 4B, 4C and 4D may correspond to the cross section of structure 184 along line 4-4 in FIG. 1C according to one implementation of the present application. In FIGS. 4A, 4B, 4C and 4D, semiconductor device 404*a*, continuous conductive structure 410 and continuous conductive structure 414 may correspond to semiconductor device 104*a*, continuous conductive structure 110 of leadframe 130, and continuous conductive structure 114 of leadframe 130, respectively, in FIG. 1C.

As illustrated in FIGS. 4A, 4B, 4C and 4D, respective single-in-line semiconductor packages 484A, 484B, 484C and 484D each include semiconductor device 404*a* situated on leadframe island 410*a* of continuous conductive structure 410, and coupled to lead 414*b* of continuous conductive structure 414 through a bond wire. Semiconductor device 404*a* includes terminal 438*a* on a top surface thereof, and terminal 442*a* on a bottom surface thereof. Terminal 438*a* of semiconductor device 404*a* is electrically connected to lead 414*b* of continuous conductive structure 414 through a bond wire. Terminal 442*a* of semiconductor device 404*a* is electrically and mechanically connected to leadframe island 410*a* of continuous conductive structure 410 by, for example, utilizing solder or conductive adhesive. Encapsulant 450 covers semiconductor device 404*a*, leadframe island 410*a* of continuous conductive structure 410, and portions of leads 410*c* and 414*b*, while the remaining portion of lead 414*b* protrudes from one side of the single-in-line semiconductor package. It is noted that a portion of lead 410*c* of continuous conductive structure 410 is removed from the single-in-line semiconductor package, and electrically insulated by optional insulation cap 448*a*.

Figure 4A:
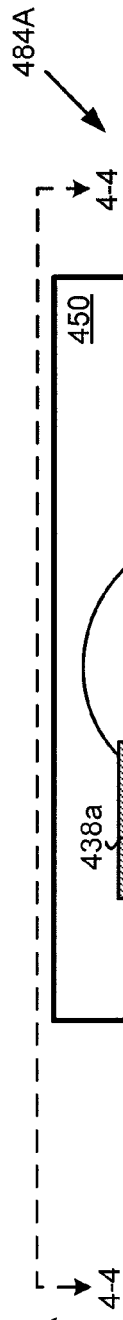
FIG. 4A illustrates a cross sectional view of a portion of a single-in-line semiconductor package according to one implementation of the present application.

As illustrated in FIG. 4A, each of continuous conductive structure 410 and continuous conductive structure 414 has a substantially uniform thickness throughout an entire length thereof. In one implementation, continuous conductive structures 410 and 414 may each have a substantially uniform thickness in a range between 0.2 to 2 mm (i.e., $10^{-3}$ meters).

Figure 4B:
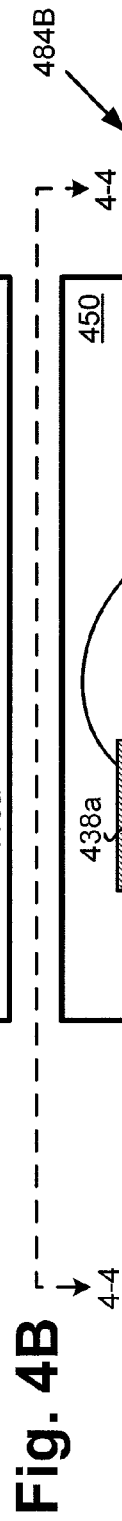
FIG. 4B illustrates a cross sectional view of a portion of a single-in-line semiconductor package according to one implementation of the present application.

As illustrated in FIG. 4B, lead 414b of continuous conductive structure 414 includes a down-set portion which is configured to reduce the thermal resistance of single-in-line semiconductor package 484B, due to the reduced distance (e.g., 0.3 to 1 mm) between the bottom surface of the down-set portion of lead 414b and the bottom surface of encapsulant 450.

Figure 4C:
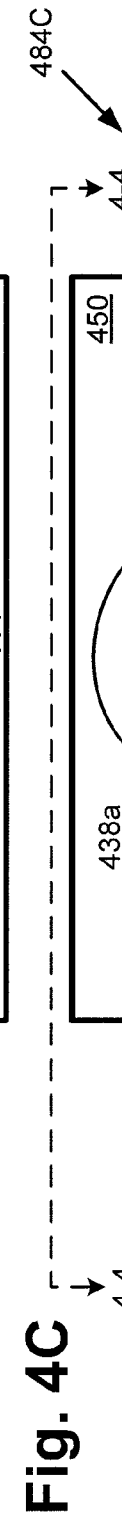
FIG. 4C illustrates a cross sectional view of a portion of a single-in-line semiconductor package according to one implementation of the present application.

As illustrated in FIG. 4C, lead 414b of continuous conductive structure 414 includes a dual gauge portion, where a portion of lead 414b retains the full thickness of continuous conductive structure 414, while the remaining portions of lead 414b retain a fraction (e.g., half-etched or quarter-etched) of the full thickness of continuous conductive structure 414 of the leadframe. The full thickness portion of lead 414b can reduce the thermal resistance, thereby improving the thermal performance, of dual-in-line semiconductor package 484C, due to the reduced distance between the bottom surface of the full thickness portion of lead 414b and the bottom surface of encapsulant 450.

Figure 4D:
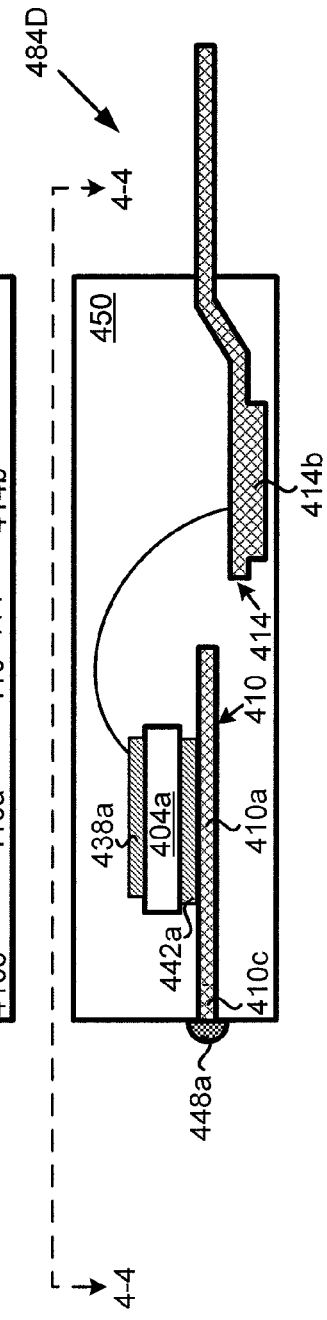
FIG. 4D illustrates a cross sectional view of a portion of a single-in-line semiconductor package according to one implementation of the present application.

As illustrated in FIG. 4D, lead 414b of continuous conductive structure 414 includes a dual gauge portion, where a portion of lead 414b retains the full thickness of continuous conductive structure 414, while the remaining portions of lead 414b retain a fraction (e.g., half-etched or quarter-etched) of the full thickness of continuous conductive structure 414 of the leadframe. The full thickness portion of lead 414b can reduce the thermal resistance, thereby improving the thermal performance, of single-in-line semiconductor package 484D, due to the reduced distance between the bottom surface of the full thickness portion of lead 414b and the bottom surface of encapsulant 450. Also, as illustrated in FIG. 4D, lead 414b of continuous conductive structure 414 includes a down-set portion, which can further reduce the thermal resistance of single-in-line semiconductor package 484D, due to the further reduced distance between the bottom surface of the down-set portion of lead 414b and the bottom surface of encapsulant 450. Although only continuous conductive structure 414 is shown to have a down-set portion and/or a dual gauge portion in FIGS. 4B-4D, it should be understood that each of continuous conductive structures 110, 112, 114, 116, 120, 122 and 124 of leadframe 130 in FIG. 1C may have a down-set portion and/or a dual gauge portion.

In another implementation, leadframe island 410a of continuous conductive structure 410 in FIGS. 4A-4D, on which semiconductor device 404a is situated, may also have a down-set portion and/or a dual gauge portion to improve thermal performance of semiconductor device 404a. Similarly, each of leadframe islands 112a, 114a and 116a of respective continuous conductive structures 112, 114 and 116 in FIG. 1C may also have a down-set portion and/or a dual gauge portion to improve thermal performance of respective semiconductor devices 108b, 104b and 106b situated thereon.

Referring to FIGS. 5A, 5B, 5C and 5D, each of FIGS. 5A, 5B, 5C and 5D illustrates a cross sectional view of a portion of a dual-in-line semiconductor package according to one implementation of the present application. For example, the cross sectional view in each of FIGS. 5A, 5B, 5C and 5D may correspond to the cross section of structure 284 along line 5-5 in FIG. 2C according to one implementation of the present application. In FIGS. 5A, 5B, 5C and 5D, first high-side power switch 504a, first high-side continuous conductive structure 510, driver IC 502 and driver IC continuous conductive structure 518 may correspond to first high-side power switch 204a, first high-side continuous conductive structure 210 of leadframe 230, driver IC 202 and driver IC continuous conductive structure 218 of leadframe 230, respectively, in FIG. 2C.

As illustrated in FIGS. 5A, 5B, 5C and 5D, respective dual-in-line semiconductor packages 584A, 584B, 584C and 584D each include first high-side power switch 504a situated on leadframe island 510a of first high-side continuous conductive structure 510, and driver IC 502 situated on leadframe island 518a of driver IC continuous conductive structure 518. First high-side power switch 504a includes power terminal 538a (e.g., a source terminal) and control terminal 540a (e.g., a gate terminal) on a top surface thereof, and power terminal 542a (e.g., a drain terminal) on a bottom surface thereof. Control terminal 540a of first high-side power switch 504a is electrically connected to driver IC 502 through bond wire 544a. Power terminal 542a of first high-side power switch 504a is electrically and mechanically connected to leadframe island 510a of first high-side continuous conductive structure 510 by, for example, utilizing solder or conductive adhesive. Although not explicitly shown in FIG. 5A, power terminal 538a of first high-side power switch 504a is electrically connected to a power terminal (e.g., a drain terminal) of a first low-side power switch, such as first low-side power switch 204b through bond wire 246a and lead 214b as illustrated in FIG. 2C. Encapsulant 550 covers first high-side power switch 504a, driver IC 502, leadframe island 510a of first high-side continuous conductive structure 510, and leadframe island 518a of driver IC continuous conductive structure 518 of the leadframe. Encapsulant 550 also covers a portion of lead 510c of first high-side continuous conductive structure 510, and a portion of lead 518b of driver IC continuous conductive structure 518 of the leadframe, while the remaining portions of lead 510c of first high-side continuous conductive structure 510 and lead 518b of driver IC continuous conductive structure 518 protrude from opposing sides of dual-in-line semiconductor package 584A.

As illustrated in FIG. 5A, each of first high-side continuous conductive structure 510 and driver IC continuous conductive structure 518 has a substantially uniform thickness throughout an entire length thereof. In one implementation, first high-side continuous conductive structure 510 and driver IC continuous conductive structure 518 may each have a substantially uniform thickness in a range between 0.2 to 2 mm (i.e., $10^{-3}$ meters).

As illustrated in FIG. 5B, driver IC continuous conductive structure 518 includes leadframe island 518a that is down set from lead 518b of driver IC continuous conductive structure 518. The down-set portion under driver IC 502 can reduce the thermal resistance of dual-in-line semiconductor package 584B, due to the reduced distance (e.g., 0.3 to 1 mm) between the bottom surface of the down-set portion of leadframe island 518a and the bottom surface of encapsulant 550.

As illustrated in FIG. 5C, leadframe island 518a of driver IC continuous conductive structure 518 includes a dual gauge portion, where a portion of leadframe island 518a directly under driver IC 502 retains the full thickness of driver IC continuous conductive structure 518 of the leadframe, while the remaining portions of leadframe island 518a retain a fraction (e.g., half-etched or quarter-etched) of the full thickness of driver IC continuous conductive structure 518 of the leadframe. The full thickness portion of driver IC continuous conductive structure 518 directly under driver IC 502 can reduce the thermal resistance, thereby improving the thermal performance, of dual-in-line semiconductor package 584C, due to the reduced distance between the bottom surface of the full thickness portion of driver IC continuous conductive structure 518 and the bottom surface of encapsulant 550.

As illustrated in FIG. 5D, leadframe island 518*a* of driver IC continuous conductive structure 518 of the leadframe includes a dual gauge portion, where a portion of leadframe island 518*a* directly under driver IC 502 retains the full thickness of driver IC continuous conductive structure 518 of the leadframe, while the remaining portions of leadframe island 518*a* retain a fraction (e.g., half-etched or quarter-etched) of the full thickness of driver IC continuous conductive structure 518 of the leadframe. The full thickness portion of driver IC continuous conductive structure 518 directly under driver IC 502 can reduce the thermal resistance, thereby improving the thermal performance, of dual-in-line semiconductor package 584D, due to the reduced distance between the bottom surface of the full thickness portion of driver IC continuous conductive structure 518 and the bottom surface of encapsulant 550. Also, as illustrated in FIG. 5D, leadframe island 518*a* of driver IC continuous conductive structure 518 is down set from lead 518*b* of driver IC continuous conductive structure 518. The down-set portion under driver IC 502 can further reduce the thermal resistance of dual-in-line semiconductor package 584D, due to the further reduced distance between the bottom surface of the down-set portion of leadframe island 518*a* and the bottom surface of encapsulant 550. Although only driver IC continuous conductive structure 518 is shown to have a down-set portion and/or a dual gauge portion in FIGS. 5B-5D, it should be understood that each of continuous conductive structures 210, 212, 214, 216, 218, 220, 222 and 224 of leadframe 230 in FIG. 2C may have a down-set portion and/or a dual gauge portion.

In another implementation, leadframe island 510*a* of first high-side continuous conductive structure 510 in FIGS. 5A-5D, on which first high-side power switch 504*a* is situated, may also have a down-set portion and/or a dual gauge portion to improve thermal performance of first high-side power switch 504*a*. Similarly, each of leadframe islands 212*a*, 214*a* and 216*a* of respective continuous conductive structures 212, 214 and 216 in FIG. 2C may also have a down-set portion and/or a dual gauge portion to improve thermal performance of respective low-side power switches 208*b*, 204*b* and 206*b* situated thereon.

Referring to FIGS. 6A, 6B, 6C and 6D, each of FIGS. 6A, 6B, 6C and 6D illustrates a cross sectional view of a portion of a single-in-line semiconductor package according to one implementation of the present application. For example, the cross sectional view in each of FIGS. 6A, 6B, 6C and 6D may correspond to the cross section of structure 288 along line 6-6 in FIG. 2E according to one implementation of the present application. In FIGS. 6A, 6B, 6C and 6D, first high-side power switch 604*a*, first high-side continuous conductive structure 610, driver IC 602 and driver IC continuous conductive structure 618 may correspond to first high-side power switch 204*a*, first high-side continuous conductive structure 210 of leadframe 230, driver IC 202 and driver IC continuous conductive structure 218 of leadframe 230, respectively, in FIG. 2E.

As illustrated in FIGS. 6A, 6B, 6C and 6D, respective single-in-line semiconductor packages 688A, 688B, 688C and 688D each include first high-side power switch 604*a* situated on leadframe island 610*a* of first high-side continuous conductive structure 610; and driver IC 602 situated on leadframe island 618*a* of driver IC continuous conductive structure 618. First high-side power switch 604*a* includes power terminal 638*a* (e.g., a source terminal) and control terminal 640*a* (e.g., a gate terminal) on a top surface thereof, and power terminal 642*a* (e.g., a drain terminal) on a bottom surface thereof. Control terminal 640*a* of first high-side power switch 604*a* is electrically connected to driver IC 602 through bond wire 644*a*. Power terminal 642*a* of first high-side power switch 604*a* is electrically and mechanically connected to leadframe island 610*a* of first high-side continuous conductive structure 610 by, for example, utilizing solder or conductive adhesive. Although not explicitly shown in FIG. 6A, power terminal 638*a* of first high-side power switch 604*a* is electrically mechanically connected to a control terminal (e.g., a drain terminal) of a first low-side power switch, such as first low-side power switch 204*b* through bond wire 246*a* and lead 214*b* as illustrated in FIG. 2E. Encapsulant 650 covers first high-side power switch 604*a*, driver IC 602, and leadframe island 610*a* of first high-side continuous conductive structure 610, leadframe island 618*a* of driver IC continuous conductive structure 618. Encapsulant 650 also covers portions of leads 610*c* and 618*b*, while the remaining portion of lead 618*b* protrudes from one side of the single-in-line semiconductor package. It is noted that a portion of lead 610*c* is removed from the single-in-line semiconductor package, and electrically insulated by optional insulation cap 648*a*.

As illustrated in FIG. 6A, each of first high-side continuous conductive structure 610 and driver IC continuous conductive structure 618 has a substantially uniform thickness throughout an entire length thereof. In one implementation, first high-side continuous conductive structure 610 and driver IC continuous conductive structure 618 may each have a substantially uniform thickness in a range between 0.2 to 2 mm (i.e., $10^{-3}$ meters).

As illustrated in FIG. 6B, driver IC continuous conductive structure 618 includes leadframe island 618*a* that is down set from lead 618*b* of driver IC continuous conductive structure 618. The down-set portion under driver IC 602 can reduce the thermal resistance of single-in-line semiconductor package 688B, due to the reduced distance between the bottom surface of the down-set portion of leadframe island 618*a* and the bottom surface of encapsulant 650.

As illustrated in FIG. 6C, leadframe island 618*a* of driver IC continuous conductive structure 618 includes a dual gauge portion, where a portion of leadframe island 618*a* directly under driver IC 602 retains the full thickness of driver IC continuous conductive structure 618 of the leadframe, while the remaining portions of leadframe island 618*a* retain a fraction (e.g., half-etched or quarter-etched) of the full thickness of driver IC continuous conductive structure 618 of the leadframe. The full thickness portion of driver IC continuous conductive structure 618 directly under driver IC 602 can reduce the thermal resistance, thereby improving the thermal performance, of single-in-line semiconductor package 688C, due to the reduced distance between the bottom surface of the full thickness portion of driver IC continuous conductive structure 618 and the bottom surface of encapsulant 650.

As illustrated in FIG. 6D, leadframe island 618*a* of driver IC continuous conductive structure 618 of the leadframe includes a dual gauge portion, where a portion of leadframe island 618*a* directly under driver IC 602 retains the full thickness of driver IC continuous conductive structure 618 of the leadframe, while the remaining portions of leadframe island 618a retain a fraction (e.g., half-etched or quarter-etched) of the full thickness of driver IC continuous conductive structure 618 of the leadframe. The full thickness portion of driver IC continuous conductive structure 618 directly under driver IC 602 can reduce the thermal resistance of single-in-line semiconductor package 688D due to the reduced distance between the bottom surface of the full thickness portion of driver IC continuous conductive structure 618 and the bottom surface of encapsulant 650. Also, as illustrated in FIG. 6D, leadframe island 618a of driver IC continuous conductive structure 618 is down set from lead 618b of driver IC continuous conductive structure 618. The down-set portion under driver IC 602 can further reduce the thermal resistance of single-in-line semiconductor package 688D, due to the further reduced distance between the bottom surface of the down-set portion of leadframe island 618a and the bottom surface of encapsulant 650. Although only driver IC continuous conductive structure 618 is shown to have a down-set portion and/or a dual gauge portion in FIGS. 6B-6D, it should be understood that each of continuous conductive structures 210, 212, 214, 216, 218, 220, 222 and 224 of leadframe 230 in FIG. 2E may have a down-set portion and/or a dual gauge portion.

In another implementation, leadframe island 610a of first high-side continuous conductive structure 610 in FIGS. 6A-6D, on which first high-side power switch 604a is situated, may also have a down-set portion and/or a dual gauge portion to improve thermal performance of first high-side power switch 604a. Similarly, each of leadframe islands 212a, 214a and 216a of respective continuous conductive structures 212, 214 and 216 in FIG. 2E may also have a down-set portion and/or a dual gauge portion to improve thermal performance of respective low-side power switches 208b, 204b and 206b situated thereon.

Figure 7:
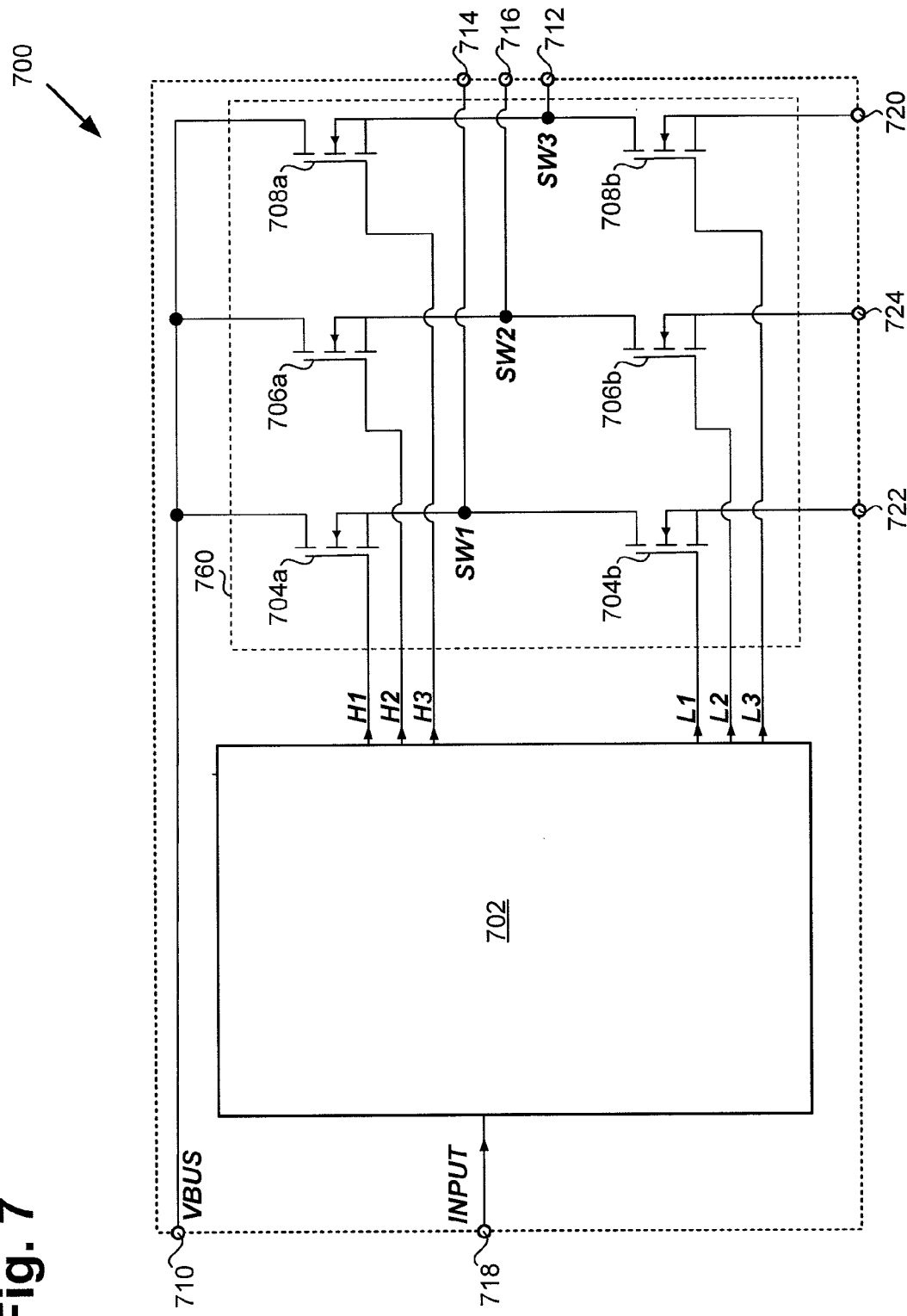
FIG. 7 illustrates a schematic diagram of an exemplary multi-phase inverter circuit of a semiconductor package according to one implementation of the present application.

Referring to FIG. 7, FIG. 7 illustrates a schematic diagram of an exemplary multi-phase inverter circuit of a semiconductor package. In FIG. 7, with similar numerals representing similar features in FIGS. 2A-2E, semiconductor package 700 includes driver integrated circuit (IC) 702 and multi-phase inverter 760. Multi-phase inverter 760 includes a U-phase having first high-side power switch 704a and first low-side power switch 704b, a V-phase having second high-side power switch 706a and second low-side power switch 706b, and a W-phase having third high-side power switch 708a and third low-side power switch 708b.

In the U-phase of multi-phase inverter 760, first high-side power switch 704a and first low-side power switch 704b are connected in a half-bridge configuration. As illustrated in FIG. 7, the drain of first high-side power switch 704a is electrically coupled to a bus voltage, VBUS, at terminal 710. The source of first high-side power switch 704a is electrically coupled to the drain of first low-side power switch 704b at switched node 714. The source of first low-side power switch 704b is electrically coupled to terminal 722. Driver IC 702 provides first high-side gate signal H1 to the gate of first high-side power switch 704a, and first low-side gate signal L1 to the gate of first low-side power switch 704b.

In the V-phase of multi-phase inverter 760, second high-side power switch 706a and second low-side power switch 706b are connected in a half-bridge configuration. As illustrated in FIG. 7, the drain of second high-side power switch 706a is electrically coupled to the bus voltage, VBUS, at terminal 710. The source of second high-side power switch 706a is electrically coupled to the drain of second low-side power switch 706b at switched node 716. The source of second low-side power switch 706b is electrically coupled to terminal 724. Driver IC 702 provides second high-side gate signal H2 to the gate of second high-side power switch 706a, and second low-side gate signal L2 to the gate of second low-side power switch 706b.

In the W-phase of multi-phase inverter 760, third high-side power switch 708a and third low-side power switch 708b are connected in a half-bridge configuration. As illustrated in FIG. 7, the drain of third high-side power switch 708a is electrically coupled to the bus voltage, VBUS, at terminal 710. The source of third high-side power switch 708a is electrically coupled to the drain of third low-side power switch 708b at switched node 712. The source of third low-side power switch 708b is electrically coupled to terminal 720. Driver IC 702 provides third high-side gate signal H3 to the gate of third high-side power switch 708a, and third low-side gate signal L3 to the gate of third low-side power switch 708b.

Driver IC 702 may include various circuit components, such as input logics, level shifters, overvoltage and under-voltage protection circuits, comparators, latches, high-side drivers, low-side drivers, capacitors, and bootstrap diodes, not explicitly shown in FIG. 7. Driver IC 702 is configured to receive one or more input signals, INPUT, from one or more input terminals 718, and provide gate signals to the power switches in multi-phase inverter 760, as described above.

It should be understood that although a semiconductor package having a multi-phase inverter and a driver IC has be shown as an implementation of the present application, other implementations of the present application may include a semiconductor package with a single phase inverter and with or without a driver IC.

Implementations of the present application offer multiple packaging options to customer with a highly adaptable leadframe (e.g., leadframe 130 in FIGS. 1A-1C and leadframe 230 in FIGS. 2A-2E) that can provide can be converted to multiple final package platforms, such as SIPs, DIPs and surface mount device (SMD) packages. The conversion process from one package platform to another can be done without reconfiguring the internal structure (e.g., arrangements of the semiconductor components or related electrical routing paths) of the leadframe package, thereby substantially reducing tooling costs as well as reducing production equipment conversion time. Moreover, implementations of the present application improve production line efficiency by avoiding multiple process set-up changes during production.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
   at least one semiconductor device situated on a leadframe island;

a first at least one lead that terminates at a first side of the semiconductor package and provides a first electrical connection to at least one terminal of the at least one semiconductor device;

a second at least one lead that protrudes from a second side of the semiconductor package and provides a second electrical connection to the at least one terminal of the at least one semiconductor device; and a continuous conductive structure configured to provide a conductive path between the first at least one lead, the second at least one lead, and the at least one terminal of the at least one semiconductor device through the leadframe island, wherein a position along a length of the first side of the semiconductor package at which the first at least one lead terminates is offset from a position along a length of the second side of the semiconductor package at which the second at least one lead protrudes such that the continuous conductive structure is asymmetric about an axis that bisects the continuous conductive structure in directions normal to the first side of the semiconductor package and the second side of the semiconductor package.

2. The semiconductor package of claim 1, wherein the semiconductor package is configured as a double-in-line (DIP) package that is convertible to a single-in-line (SIP) package.

3. The semiconductor package of claim 1, wherein the semiconductor package comprises a single-in-line (SIP) package.

4. The semiconductor package of claim 1, further comprising an insulation cap disposed on a surface of the first at least one lead.

5. The semiconductor package of claim 1, wherein the at least one semiconductor device is a power switch selected from the group consisting of:
a power metal-oxide-semiconductor field effect transistor (MOSFET);
an insulated gate bipolar transistor (IGBT);
a high electron mobility transistor (HEMT); and
a diode.

6. The semiconductor package of claim 5, wherein the HEMT comprises at least one of a Gallium Nitride (GaN) or silicon carbide HEMT.

7. The semiconductor package of claim 1, wherein the at least one semiconductor device is coupled to a driver integrated circuit (IC) situated on another continuous conductive structure.

8. The semiconductor package of claim 1, wherein the semiconductor package comprises a surface mount device (SMD) package.

9. The semiconductor package of claim 1, wherein the at least one semiconductor device is a first power switch, the semiconductor package further comprising:
a second power switch and a third power switch each one situated on the leadframe island, wherein each one of the first, second and third power switch is situated on the leadframe island in an orientation such that the continuous conductive structure corresponds to a power supply node for each one of the first, second and third power switch.

10. The semiconductor package of claim 1, wherein the at least one semiconductor device is a first semiconductor device, the leadframe island is a first leadframe island, and the continuous conductive structure is a first continuous conductive structure, the semiconductor package further comprising:

a second semiconductor device situated on a second leadframe island;

a fourth lead that terminates at the first side of the semiconductor package and provides a first electrical connection to a terminal of the second semiconductor device;

a fifth lead that protrudes from the second side of the semiconductor package and that provides a second electrical connection to the terminal of the second semiconductor device; and a second continuous conductive structure configured to provide a conductive path between the fourth lead, the fifth lead, and the terminal of the second semiconductor device through the second leadframe island, wherein a position along the length of the first side of the semiconductor package at which the fourth lead terminates is offset from a position along the length of the second side of the semiconductor package at which the fifth lead protrudes such that the second continuous conductive structure is asymmetric about the axis that bisects the continuous conductive structure in directions normal to the first side of the semiconductor package and the second side of the semiconductor package.

11. The semiconductor package of claim 10, further comprising:
a third leadframe island;
a sixth lead that terminates at the first side of the semiconductor package and provides a first electrical connection to the third leadframe island;
a seventh lead that protrudes from the second side of the semiconductor package and that provides a second electrical connection to the third leadframe island; and
a third continuous conductive structure configured to provide a conductive path between the sixth lead, the seventh lead and through the third leadframe island, wherein a position along the length of the first side of the semiconductor package at which the sixth lead terminates is coincident with a position along the length of the second side of the semiconductor package at which seventh lead protrudes such that the second continuous conductive structure is symmetric about the axis that bisects the continuous conductive structure in directions normal to the first side of the semiconductor package and the second side of the semiconductor package.

12. The semiconductor package of claim 11, wherein the first semiconductor device and the second semiconductor device define a half-bridge circuit, and the first continuous conductive structure corresponds to a first power supply node, the second continuous conductive structure corresponds to an output node and the third continuous conductive structure corresponds to a second power supply node of the half-bridge circuit.

13. A molded leadframe package comprising:
a continuous conductive structure that is defined by a leadframe island, a first at least one lead and a second at least one lead; and
at least one semiconductor power switch coupled to the leadframe island;
wherein the first at least one lead terminates at a first side of the molded leadframe package and the second at least one lead protrudes from a second side of the molded leadframe package that is opposite the first side, and a position along a length of the first side at which the first at least one lead terminates is offset from a position along a length of the second side at which the second at least one lead protrudes such that the continuous conductive structure is asymmetric about an axis that bisects the continuous conductive structure in directions normal to the first side and the second side.

14. The molded leadframe package of claim 13, wherein the molded leadframe package is configured as a double-in-line (DIP) package that is convertible to a single-in-line (SIP) package.

15. The molded leadframe package of claim 13, wherein the molded leadframe package comprises a single-in-line (SIP) package.

16. The molded leadframe package of claim 15, further comprising an insulation cap disposed on a surface of the first at least one lead.

17. The molded leadframe package of claim 13, wherein the at least one semiconductor power switch is selected from the group consisting of:
   a power metal-oxide-semiconductor field effect transistor (MOSFET);
   an insulated gate bipolar transistor (IGBT);
   a high electron mobility transistor (HEMT); and
   a diode.

18. The molded leadframe package of claim 17, wherein the HEMT comprises at least one of a Gallium Nitride (GaN) or silicon carbide HEMT.

19. The molded leadframe package of claim 13, wherein the at least one semiconductor power switch is coupled to a driver integrated circuit (IC) situated on another continuous conductive structure.

20. The molded leadframe package of claim 13, wherein the molded leadframe package comprises a surface mount device (SMD) package.

* * * * *